(12) United States Patent
Weaver et al.

(10) Patent No.: US 6,780,374 B2
(45) Date of Patent: Aug. 24, 2004

(54) METHOD AND APPARATUS FOR PROCESSING A MICROELECTRONIC WORKPIECE AT AN ELEVATED TEMPERATURE

(75) Inventors: Robert A. Weaver, Whitefish, MT (US); Gregory J. Wilson, Kalispell, MT (US); Paul R. McHugh, Kalispell, MT (US)

(73) Assignee: Semitool, Inc., Kalispell, MT (US)

( * ) Notice: Subject to any disclaimer, the term of this patent is extended or adjusted under 35 U.S.C. 154(b) by 47 days.

(21) Appl. No.: 09/733,608

(22) Filed: Dec. 8, 2000

(65) Prior Publication Data

US 2002/0096508 A1 Jul. 25, 2002

(51) Int. Cl.[7] ................................................. C21D 1/06
(52) U.S. Cl. .................... 266/252; 266/256; 219/444.1; 219/468.1
(58) Field of Search .................. 266/256, 252; 118/725

(56) References Cited

U.S. PATENT DOCUMENTS

| | | | |
|---|---|---|---|
| 4,030,015 A | 6/1977 | Herko et al. |
| 4,113,391 A | 9/1978 | Minowa |
| 4,443,117 A | 4/1984 | Muramoto et al. |
| 4,475,823 A | 10/1984 | Stone |
| 4,687,552 A | 8/1987 | Early et al. |
| 4,951,601 A | 8/1990 | Maydan et al. |
| 4,979,464 A | 12/1990 | Kunze-Concewitz et al. |
| 5,155,336 A | 10/1992 | Gronet et al. |
| 5,252,807 A | 10/1993 | Chizinsky |
| 5,306,895 A | 4/1994 | Ushikoshi et al. |

(List continued on next page.)

FOREIGN PATENT DOCUMENTS

| | | |
|---|---|---|
| EP | 0 881 673 A2 | 12/1998 |
| EP | 0 964 433 A2 | 12/1999 |
| EP | 0 982 771 A1 | 3/2000 |
| EP | 1 069 213 A2 | 1/2001 |
| JP | 10-083960 | 3/1998 |
| WO | WO 91/04213 | 4/1991 |
| WO | WO99/40615 | 8/1999 |
| WO | WO99/45745 | 9/1999 |
| WO | WO00/61837 | 10/2000 |

OTHER PUBLICATIONS

Woo Sik Yoo et al., "Rapid Thermal Furnace," *Solid State Technology*, Jul. 2000, pp. 223–224, 226, 228, 230.

(List continued on next page.)

*Primary Examiner*—Sikyin Ip
(74) *Attorney, Agent, or Firm*—Perkins Coie LLP

(57) ABSTRACT

An apparatus and method for processing a microelectronic workpiece at an elevated temperature. In one embodiment, the apparatus includes a workpiece support positioned to engage and support the microelectronic workpiece during operation. The apparatus can further include a heat source having a solid engaging surface positioned to engage a surface of the microelectronic workpiece with at least one of the heat source and the workpiece support being movable relative to the other between a first position with the microelectronic workpiece contacting the engaging surface of the heat source and a second position with the microelectronic workpiece spaced apart from the engaging surface. The heat source is sized to transfer heat to the microelectronic workpiece at a rate sufficient to thermally process a selected material of the microelectronic workpiece when the microelectronic workpiece is engaged with the heat source. A heat sink can be positioned at least proximate to the heat source to cool both the heat source and the microelectronic workpiece.

27 Claims, 20 Drawing Sheets

U.S. PATENT DOCUMENTS

| | | |
|---|---|---|
| 5,391,517 A | 2/1995 | Gelatos et al. |
| 5,411,076 A | 5/1995 | Matsunaga et al. |
| 5,431,803 A | 7/1995 | DiFranco et al. |
| 5,567,267 A | 10/1996 | Kazama et al. |
| 5,584,971 A | 12/1996 | Komino |
| 5,600,532 A | 2/1997 | Michiya et al. |
| 5,650,082 A | 7/1997 | Anderson |
| 5,651,823 A | 7/1997 | Parodi et al. |
| 5,660,472 A | 8/1997 | Peuse et al. |
| 5,802,856 A | 9/1998 | Schaper et al. |
| 5,892,207 A | 4/1999 | Kawamura et al. |
| 5,937,142 A | 8/1999 | Moslehi et al. |
| 6,017,820 A | 1/2000 | Ting et al. |
| 6,072,160 A | 6/2000 | Bahl |
| 6,072,163 A | 6/2000 | Armstrong et al. |
| 6,073,681 A * | 6/2000 | Getchel et al. ............ 165/80.1 |
| 6,086,680 A | 7/2000 | Foster et al. |
| 6,107,192 A | 8/2000 | Subrahmanyan et al. |
| 6,108,937 A | 8/2000 | Raaijmakers |
| 6,130,415 A | 10/2000 | Knoot |
| 6,136,163 A | 10/2000 | Cheung et al. |
| 6,139,703 A | 10/2000 | Hanson et al. |
| 6,157,106 A | 12/2000 | Tietz et al. |
| 6,184,068 B1 | 2/2001 | Ohtani et al. |
| 6,278,089 B1 | 8/2001 | Young et al. |
| 6,280,183 B1 | 8/2001 | Mayur et al. |
| 6,297,154 B1 | 10/2001 | Gross et al. |
| 6,471,913 B1 * | 10/2002 | Weaver et al. .............. 266/256 |

OTHER PUBLICATIONS

Satheesh Kuppurao et al., "Rapid Thermal Oxidation Technique," *Solid State Technology*, Jul. 2000, pp. 233–234, 236 & 239.

Nick Osborne et al., "Hot–Wall Furnace RTP," *Solid State Technology*, Jul. 2000, pp. 211–212, 214, 216 & 217.

Bruce Peuse et al., "Advances in RTP Temperature Measurement and Control," Materials Research Society Symposium—Spring 98, pp. 1–15.

R.P.S. Thakur et al., "RTP technology for tomorrow," Jun. 1, 1998, http://www.semipark.co.kr./ifil/%EA%b8%.../RTP%20technology%20for%20tomorrow.ht, Feb. 28, 2001.

U.S. patent application, Ser. No. 09/018,783, Ritzdorf et al, filed Feb. 4, 1998.

PCT International Search Report for International Application No. PCT/US01/04444; mailed Dec. 15, 2001; Applicant: Semitool, Inc.

* cited by examiner

METHOD AND APPARATUS FOR PROCESSING A MICROELECTRONIC WORKPIECE AT AN ELEVATED TEMPERATURE

TECHNICAL FIELD

The present invention is generally directed to methods and apparatuses for processing one or more microelectronic workpieces at elevated temperatures.

BACKGROUND OF THE INVENTION

In the production of semiconductor integrated circuits and other microelectronic articles from microelectronic workpieces, such as semiconductor wafers, it is often necessary to provide multiple metal layers on a substrate to serve as interconnect metallization that electrically connects the various devices on the integrated circuit to one another. Traditionally, aluminum has been used for such interconnects, however, it is now recognized that copper metallization may be preferable. Copper interconnects can help alleviate many of the problems experienced in connection with the current aluminum technology.

The microelectronic fabrication industry has sought to use copper as the interconnect metallization by using a damascene and/or patterned plating electroplating process where holes (e.g., vias), trenches and other recesses are used to produce the desired copper patterns. In a typical damascene process, a dielectric layer is applied to the wafer and recesses are formed in the wafer. A metallic seed layer and barrier/adhesion layer are then disposed over the dielectric layer and into the recesses. The seed layer is used to conduct electrical current during a subsequent metal electroplating step. Preferably, the seed layer is a very thin layer of metal that can be applied using one of several processes. For example, the seed layer of metal can be applied using physical vapor deposition or chemical vapor deposition processes to produce a layer on the order of 1000 angstroms thick or less. The seed layer can also be formed of copper, gold, nickel, palladium, and most or all other metals. The seed layer conforms to the surface of the wafer, including the recesses, or other depressed or elevated device features.

In single copper electroplating damascene processes, two electroplating operations are generally employed. First, a copper layer is electroplated on the seed layer to form a blanket layer. The blanket layer fills the trenches or other recesses that define the horizontal interconnect wiring in the dielectric layer. The first blanket layer is then planarized (for example, by chemical-mechanical planarization) to remove those portions of the layer extending above the trenches, leaving the trenches filled with copper. A second dielectric layer is then provided to cover the wafer surface and recessed vias are formed in the second dielectric layer. The recessed vias are positioned to align with certain of the filled trenches. A second seed layer and a second copper blanket layer are applied to the surface of the second dielectric layer to fill the vias. The wafer is planarized again to remove copper extending above the level of the vias. The vias thus provide a vertical connection between the original horizontal interconnect layer and a subsequently applied horizontal interconnect layer. Electrochemical deposition of copper films has thus become an important process step in the manufacturing of high-performance microelectronic products.

Alternatively, the trenches and vias may be etched in the dielectric at the same time in what is commonly called a "dual damascene" process. These features are then processed, as above, with a barrier layer, a seed layer and a fill/blanket layer that fill the trenches and vias disposed at the bottoms of the trenches at the same time. The excess material is then polished, as above, to produce inlaid conductors.

The mechanical properties of the copper metallization can be quite important as the metal structures are formed. This is particularly true in connection with the impact of the mechanical properties of the copper metallization during chemical mechanical polishing. Wafer-to-wafer and within wafer grain size variability in the copper film can adversely affect the polish rate of the chemical mechanical processing as well as the ultimate uniformity of the surfaces of the polished copper structures. Large grain size and low variations in grain size in the copper film are very desirable.

The electrical properties of the copper metallization features are also important to the performance of the associated microelectronic device. Such devices may fail if the copper metallization exhibits excessive electromigration that ultimately results in an open or short circuit condition in one or more of the metallization features. One factor that has a very large influence on the electromigration resistance of submicron metal lines is the grain size of the deposited metal. This is because grain boundary migration occurs with a much lower activation energy than trans-granular migration.

To achieve the desired electrical characteristics for the copper metallization, the grain structure of each deposited blanket layer is altered through an annealing process. This annealing process is traditionally thought to require the performance of a separate processing step at which the semiconductor wafer is subject to an elevated temperature of about 400 degrees Celsius. The relatively few annealing apparatus that are presently available are generally stand-alone batch units that are often designed for batch processing of wafers disposed in wafer boats.

One single wafer annealing device is disclosed in U.S. Pat. No. 6,136,163 to Cheung. This device includes a chamber that encloses cold plate and a heater plate beneath the cold plate. The heater plate in turn is spaced apart from and surrounds a heater and a lift plate. The lift plate includes support pins that project up though the heater and the heater plate to support a wafer. The support pins can move upwardly to move the wafer near the cold plate and downwardly to move the wafer near or against the heater plate. One potential drawback with this device is that the chamber encloses a large volume which can be expensive and time consuming to fill with purge gas and/or process gas. Another potential drawback is that the heater may not efficiently transfer heat to the heat plate. Still a further drawback is that the heater plate may continue to heat the wafer after the heating phase of the annealing process is complete, and may limit the efficiency of the cold plate.

Another single wafer device directed to the photolithography field is disclosed in U.S. Pat. No. 5,651,823 to Parodi et al. This device includes heating and cooling units in separate chambers to heat and cool photoresist layers. Accordingly, the device may be inadequate and/or too time consuming for use in an annealing process because the wafer must be placed in the heating chamber, then removed from the heating chamber and placed in the cooling chamber for each annealing cycle. Furthermore, the transfer arm that moves the wafer from one chamber to the next will generally not have the same temperature as the wafer when it contacts the wafer, creating a temperature gradient on the wafer that can adversely affect the uniformity of sensitive thermal processes.

SUMMARY

The present invention is directed toward apparatuses and methods for processing a microelectronic workpiece at an elevated temperature. An apparatus in accordance with one embodiment of the invention includes a workpiece support positioned to engage and support the microelectronic workpiece during operation. The apparatus can further include a heat source having a solid engaging surface positioned to engage a surface of the microelectronic workpiece. The heat source can further include a heat generator attached directly to and/or integrated with the heat source. At least one of the heat source and the workpiece support is movable relative to the other between a first position with the microelectronic workpiece contacting the engaging surface of the heat source during operation, and a second position with the microelectronic workpiece spaced apart from the engaging surface. The heat source is sized to transfer heat to the microelectronic workpiece at a rate sufficient to thermally process (for example, anneal) a selected material of the microelectronic workpiece when the microelectronic workpiece is engaged with the heat source.

In a further aspect of the invention, the apparatus can include a workpiece support positioned to engage and support the microelectronic substrate, a heat source positioned at least proximate to the workpiece support, and a first heat sink positioned at least proximate to the heat source to cool the heat source. The apparatus can further include a second heat sink positioned at least proximate to the first heat sink to cool the first heat sink. The first heat sink can be movable relative to the heat source and the second heat sink between a first position with the first heat sink engaged with a heat source to cool the heat source, and a second position with the first heat sink engaged with the second heat sink to cool the first heat sink. In a further aspect of this embodiment, the heat source can be positioned above the first heat sink.

In still a further aspect of the invention, a plurality of thermal processing chambers can be positioned one above the other to independently thermally process a plurality of microelectronic workpieces. The thermal processing chambers can have a modular construction such that a lower surface of an upper chamber defines an upper surface of the chamber below.

In yet a further aspect of the invention, the apparatus can include a workpiece support configured to support the microelectronic workpiece and a heat source positioned proximate to the workpiece support. The heat source can have a first region configured to transfer heat to the microelectronic workpiece at a first rate per unit area of the microelectronic workpiece. The heat source can further include a second region configured to transfer heat to the microelectronic workpiece at second rate per unit area of the microelectronic workpiece, with the second rate per unit area being greater than the first rate per unit area. The invention is also directed toward a method for thermally processing a microelectronic workpiece. In one aspect of the invention, the method can include engaging the microelectronic workpiece with a solid heat transfer surface of a heat source, directing heat into the heat source with a heat generator attached directly to and/or integral with the heat source, and transferring heat from the solid surface to the microelectronic workpiece at a rate sufficient to thermally process a selected material of the microelectronic workpiece. The method can further include cooling the microelectronic workpiece and disengaging the microelectronic workpiece from the solid surface.

In a further aspect of the invention, the method can further include at least partially enclosing the microelectronic workpiece by engaging a lid positioned proximate to one side of the microelectronic workpiece with a base supporting the solid heat transfer surface and positioned proximate to an opposite side of the microelectronic workpiece, with the microelectronic workpiece positioned between the lid and the base. The method can further include purging a region adjacent to the microelectronic workpiece of oxidizing agents by supplying a purge fluid to the region. In another aspect of the invention, the method can include transferring heat to one region of the microelectronic workpiece at a different rate per unit area than transferring heat to a second region of the microelectronic workpiece. In still a further aspect of the invention, the method can include heating the solid heat transfer surface with an electrical resistance heater and offsetting a conductive heat loss at a connection terminal of the heater by sizing a connector attached to the terminal to generate electrical resistance heat.

A method in accordance with another aspect of the invention can include forming a plurality of chambers for thermally processing a microelectronic workpiece by providing a first annealing chamber having an first portion, a second portion proximate to the first portion, and a first cavity between the first and second portions. The first cavity is configured to receive a single microelectronic workpiece. The method can further include positioning a third portion proximate to the second portion with the second and third portions defining a second cavity therebetween configured to receive another microelectronic workpiece. The method can still further include disposing a first heat source in the first cavity and disposing a second heat source in the second cavity.

BRIEF DESCRIPTION OF THE DRAWINGS

FIGS. 4A–7B illustrate various manners in which the thick film heater and a heat sink may cooperate with one another in a thermal transfer unit in accordance with an embodiment of the invention.

DETAILED DESCRIPTION

For purposes of the present application, a microelectronic workpiece is defined to include a workpiece formed from a substrate upon which microelectronic circuits or components, data storage elements or layers, and/or micromechanical elements are or may be formed. Although the present invention is applicable to this wide range of products, the invention will be particularly described in connection with its use in the production of interconnect structures formed during the production of integrated circuits on a semiconductor wafer. Still further, although the invention is applicable for use in connection with a wide range of metal and metal alloys as well as in connection with a wide range of elevated temperature processes, the invention will be particularly described in connection with annealing of electrochemically deposited copper and copper alloys.

Figure 1:
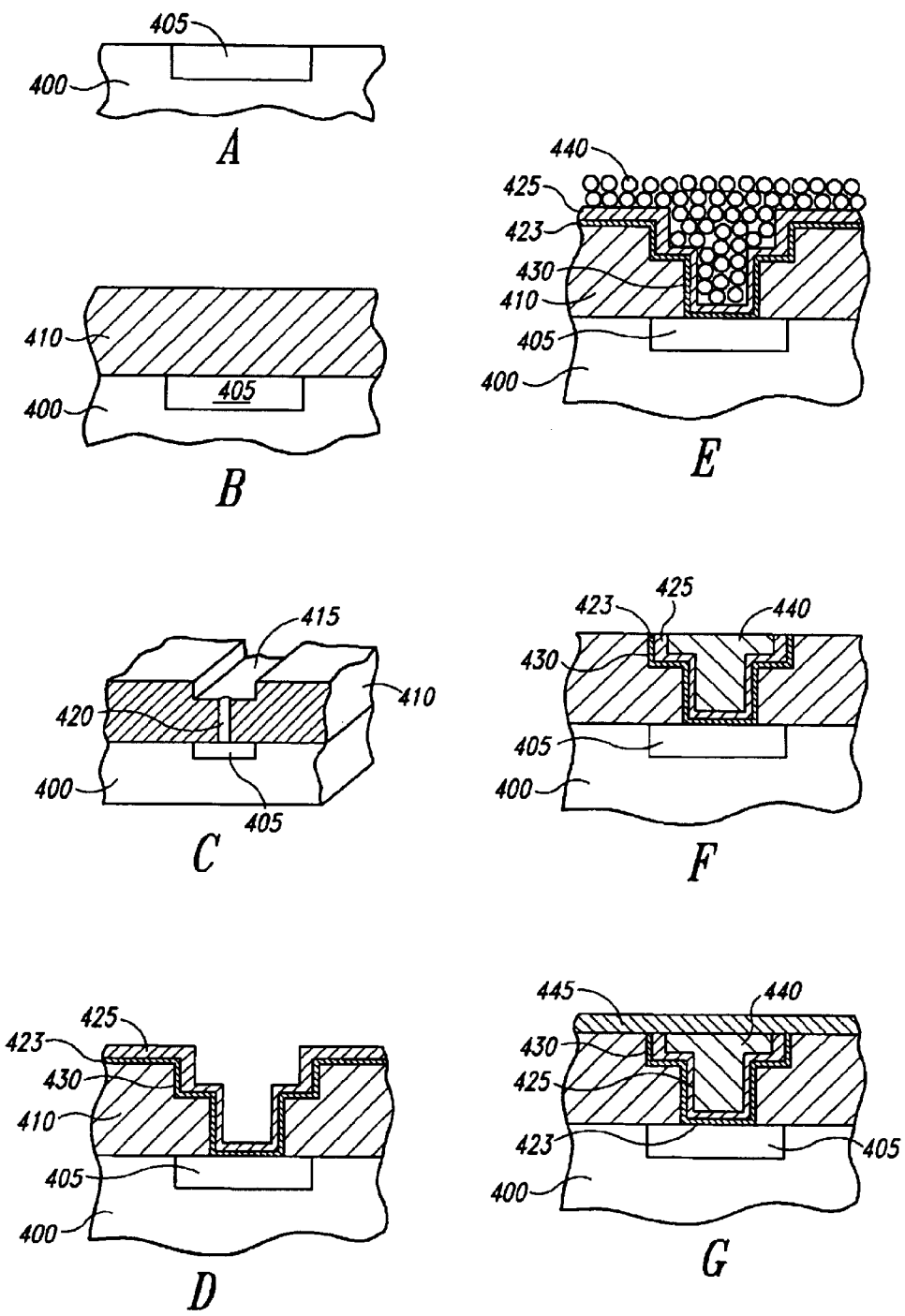
FIGS. 1A–1G illustrate the various steps used to deposit a metal in micro-structures formed in the surface of a microelectronic workpiece, such metal structures being suitable for annealing in a thermal reactor in accordance with an embodiment of the present invention.

Before a metal layer or structure can be annealed in a thermal reactor corresponding to an embodiment of the present invention, the metal layer or structure is first disposed on the surface of the microelectronic workpiece. The metal can be disposed by electrochemical deposition techniques (such as electroless deposition or electrolytic deposition), vacuum techniques (such as physical vapor deposition (PVD) or chemical vapor deposition (CVD)), or other techniques. FIGS. 1A–1G illustrate one method of filling a trench and via formed on the surface of a microelectronic workpiece. FIG. 1A illustrates an assembly 400 having an area 405 that is to be connected by copper metallization. In FIG. 1B a layer 410 of dielectric material, such as silicon dioxide or a low-K dielectric material, is deposited over the second assembly 400 including over area 405. Through a photoresist process and reactive ion etch or the like, selective portions of layer 410 are removed to form, for example, a trench 415 and via 420 into which copper metallization is to be deposited. The end structure is shown in the perspective view of FIG. 1C wherein the via 420 overlies connection area 405 and trench 415 overlies via 420. Connection area 405 may be, for example, a metallization feature above the substrate.

As shown in FIG. 1D, a barrier layer 423 and seed layer 425 may be disposed on the surface of dielectric layer 410. The barrier layer 423 may be, for example, tantalum or titanium nitride. The barrier layer 423 is typically used when the structure 405 is susceptible to contamination from copper or the seed layer metal, and/or when the seed layer metal or copper may readily migrate through the dielectric layer 410 and contaminate other portions of the microelectronic circuit. As such, the barrier layer 423 should be sufficiently thick along the contour of the trenches and vias to act as a diffusion barrier. The barrier layer 423 may also function as an adhesion layer to facilitate binding between the seed layer 425 and the dielectric layer 410. If, however, the structure 405 is not susceptible to such contamination, there is sufficient adhesion, and the dielectric layer 410 itself acts as a barrier layer, then a separate barrier layer 423 may not be necessary. The seed layer 425 may, for example, be a copper layer or other conductive metal layer and is preferably at least 200 Angstroms thick at its thinnest point. Sidewalls 430 of the trench 415 and via 420 as well as the bottom of via 420 should be covered by the seed layer 425 and barrier layer 423 to facilitate a subsequent electrochemical copper deposition step. The seed layer 425 may be deposited through, for example, a CVD or PVD process.

The microelectronic workpiece with the seed layer 425 can be subjected to a subsequent electrochemical copper deposition process. The electrochemical copper deposition process can be executed so as to form numerous nucleation sites for the copper deposition to thereby form grain sizes that are substantially smaller than the characteristic dimensions of the via 420 and trench 415. An exemplary structure having such characteristics is illustrated in FIG. 1E wherein layer 440 is a layer of copper metallization that has been deposited using an electrochemical deposition process. In another aspect of this process, the grains can also be oriented such that the [111] crystal plane direction is perpendicular to the plane of the exposed copper layer, as disclosed in published PCT Application WO 99/40615, incorporated herein in its entirety by reference.

As shown in FIG. 1E, the copper metallization 440 formed in the electrochemical deposition process is deposited over the seed layer 425 and extends a distance above the surface of dielectric layer 410. Because the only features that are to contain the metallization are the via 420 and trench 415, excess copper above the dielectric layer 410 must be removed. Removal of the excess copper above the upper surface of the dielectric layer 410 may be executed using a chemical mechanical polish technique. An exemplary structure in which such removal has taken place is illustrated in FIG. 1F. After such removal, a capping barrier layer 445 may be disposed, for example, over the entire surface of the wafer, or the processes set forth in FIGS. 1A–1F may be repeated without a capping barrier layer 445 whereby the trench 415, now filled with copper metallization, corresponds to the structure 405 that further copper metallization is to contact.

The process illustrated in FIGS. 1A–1G indicates that the via 420 and trench 415 are formed together. However, it will be recognized that the structures may be generally formed and filled separately in accordance with the single-damascene process described above. In such instances, the via 420 is first plated in accordance with the steps set forth in FIGS. 1A–1F while the trench 415 is subsequently plated in accordance with the steps set forth in FIGS. 1A–1F after plating of the via 420 has been completed. In effect, the via 420 corresponds to the structure 405 during plating of the trench 415. The thermal reactor and associated methods disclosed herein are suitable for use in both single-damascene and multi-damascene processes.

A comparison between FIGS. 1E and 1F reveals that an increase in the grain size of the copper layer 440 has taken place. This change in the grain size can be deliberately accelerated in accordance with an embodiment of the present invention by subjecting the microelectronic workpiece to an annealing process in the thermal reactor disclosed below. In such an annealing process, the wafer is raised to an elevated temperature that is above the ambient temperature conditions normally found in a clean room. The annealing can take place at a temperature at or below about 250–300 degrees Celsius, or at least below the temperature at which the material used for the dielectric layer begins to degrade. Annealing at these temperatures is particularly advantageous when the dielectric layer is formed from a low-K dielectric material since such materials may begin to degrade at elevated temperatures above 300 degrees Celsius.

Annealing is particularly advantageous when used prior to chemical mechanical planarization (CMP). CMP involves the use of mechanical and chemical forces to remove copper (or another material) that is deposited in excess of the amount required for interconnects (see FIGS. 1E and 1F). In accordance with an embodiment of the present invention, the accelerated annealing process stabilizes the grain structure of the copper film by significantly reducing the amount of time required for film re-crystallization to occur (i.e., transforming many small grains into fewer large grains). The accelerated annealing process, in accordance with the present invention, can also reduce the variation in the grain size distribution which is seen to occur during a room-temperature self-annealing process. The CMP polish rate, or removal rate, has been observed to vary as a direct result of the grain size of the copper film. The initial, small grained (i.e., many grain boundaries) films have been observed to polish slower (at least with a particular CMP slurry) than large grained films. Similarly, the uniformity of the CMP polish has been observed to vary as a direct result of the grain size uniformity of the copper film. Therefore, in accordance with an embodiment of the present invention, the accelerated annealing process can reduce the time required for the CMP process, while improving its uniformity, predictability and repeatability.

Figure 2:
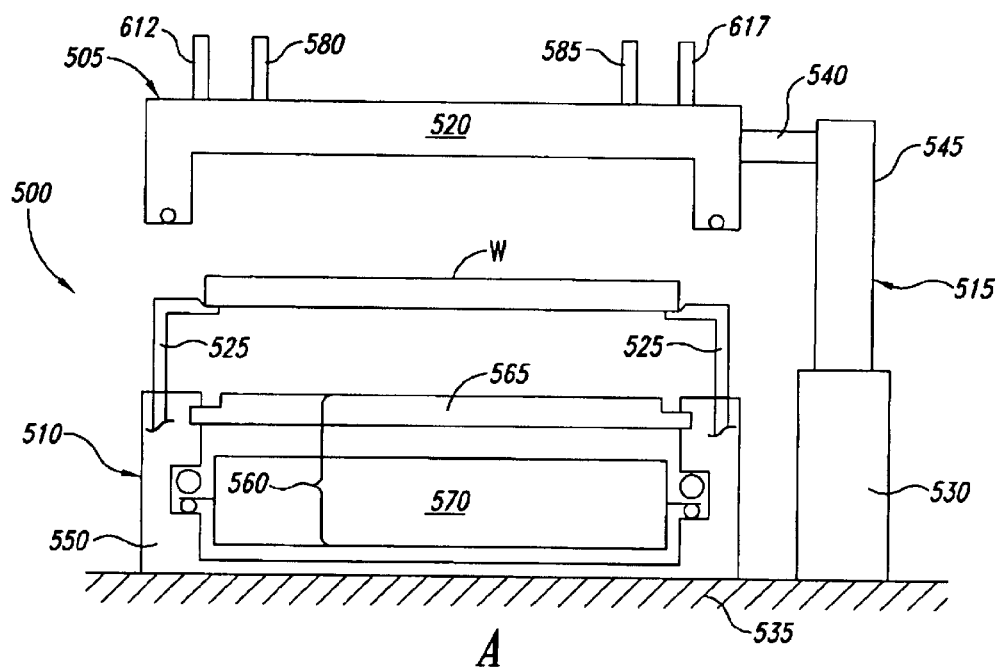
FIGS. 2A–2D are schematic block diagrams of thermal reactors constructed in accordance with two embodiments of the present invention.
Figure 2:
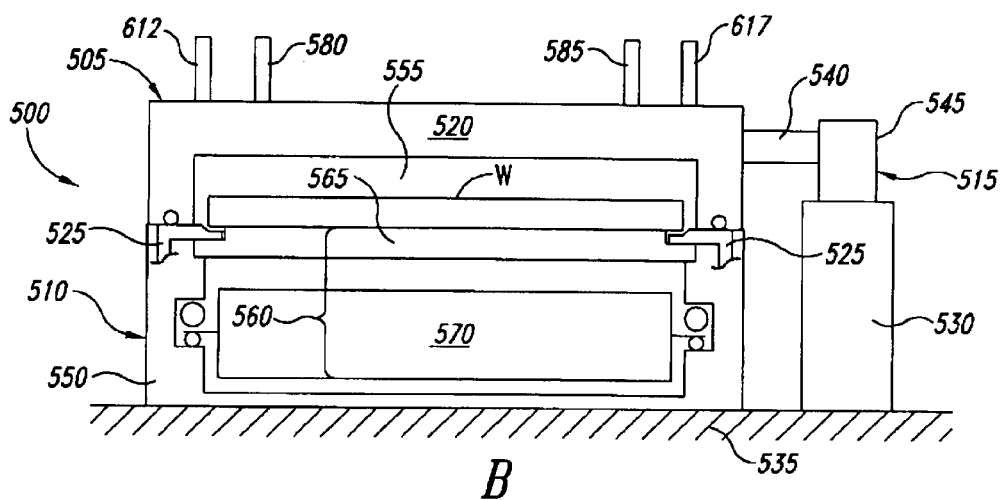
Figure 2:
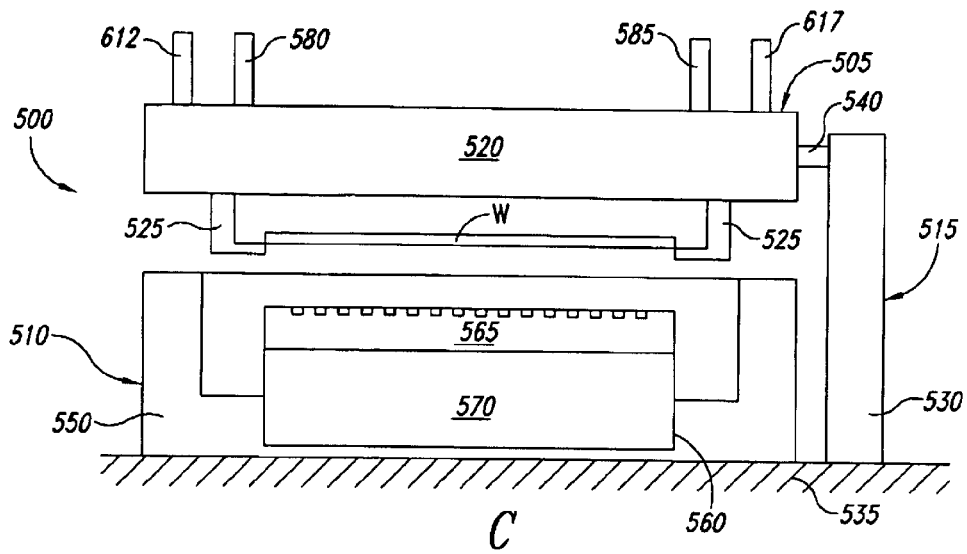
Figure 2:
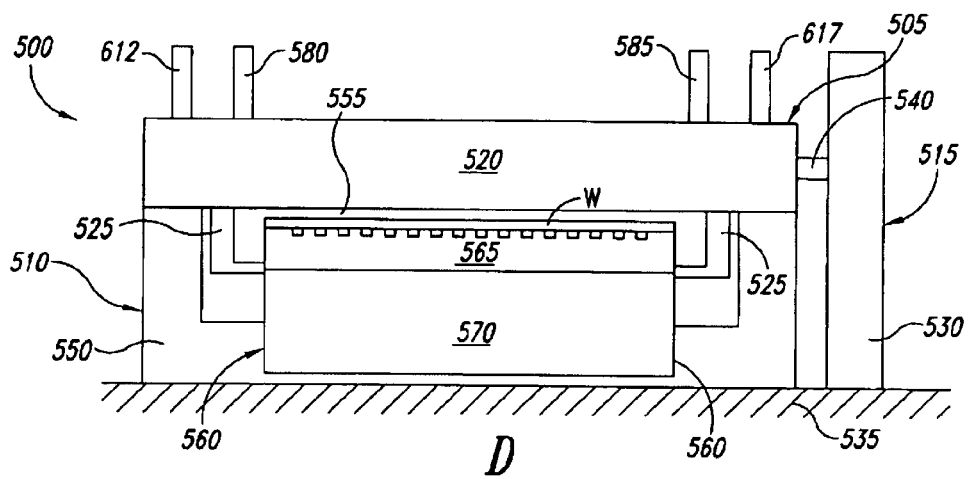
Figure 3:
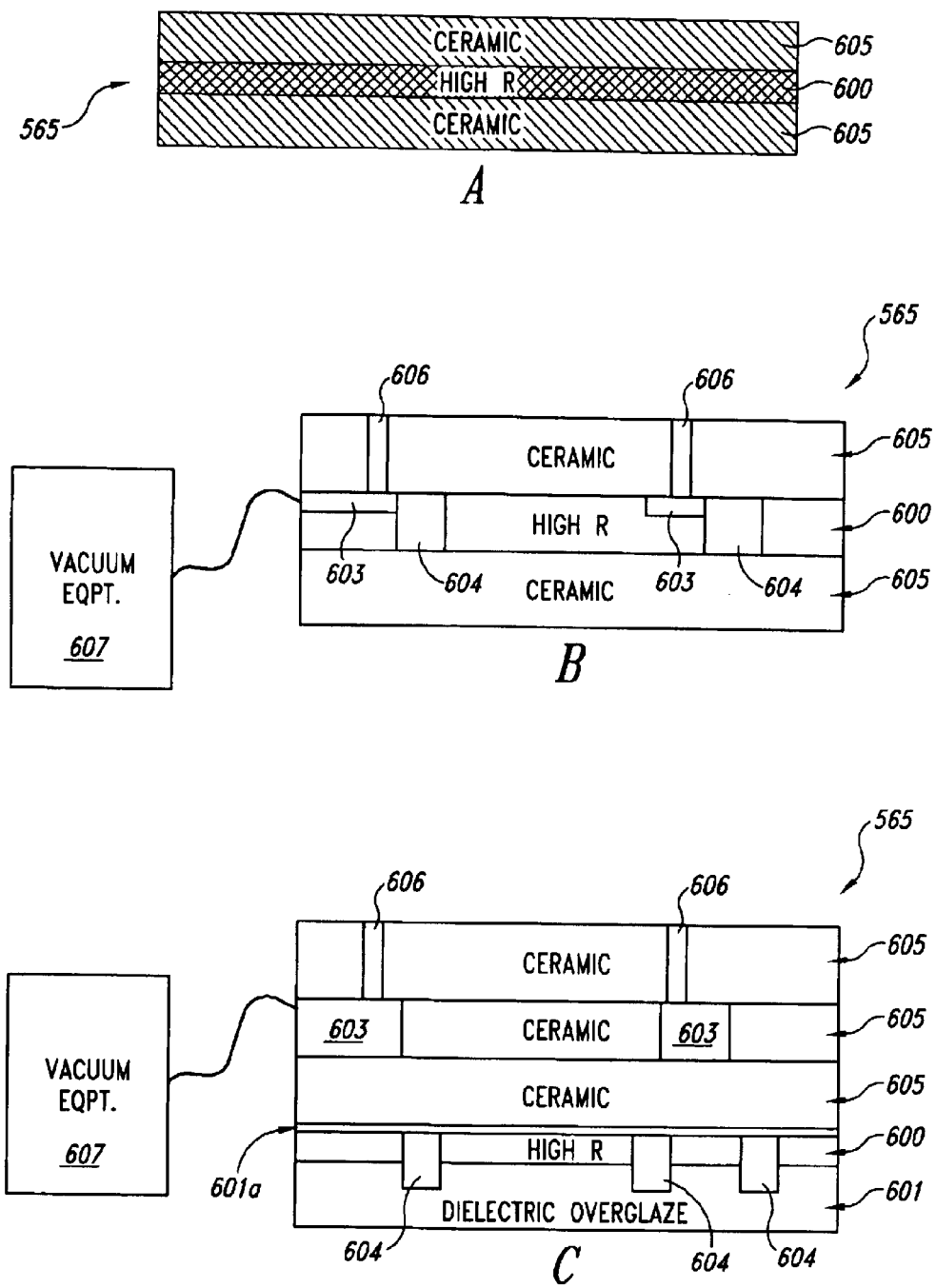
FIGS. 3A–3F are cross-sectional views of further embodiments of a thick film heater that may be used in thermal transfer units of the thermal reactors shown in FIGS. 2A–2D.
FIGS. 3G–3J are plan views of various elements that can form the thick film heater constructions illustrated in FIGS. 3A–3F.
Figure 3:
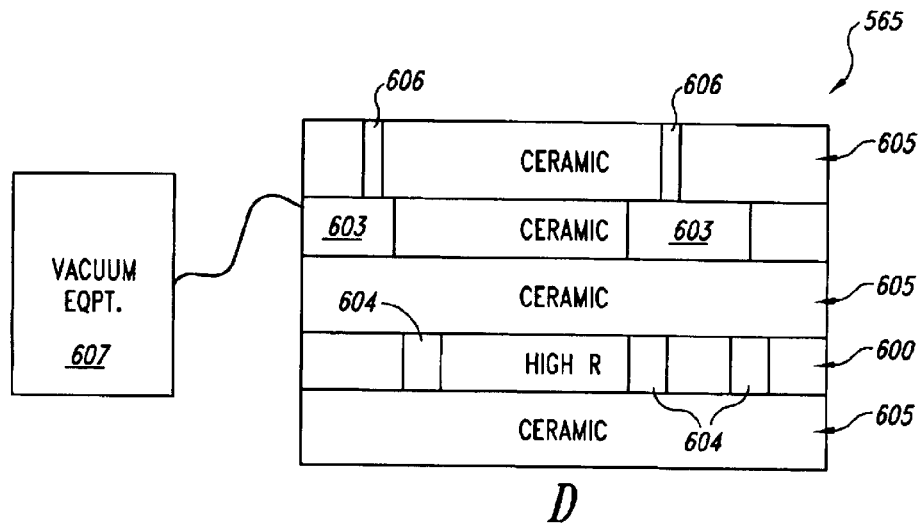
Figure 3:
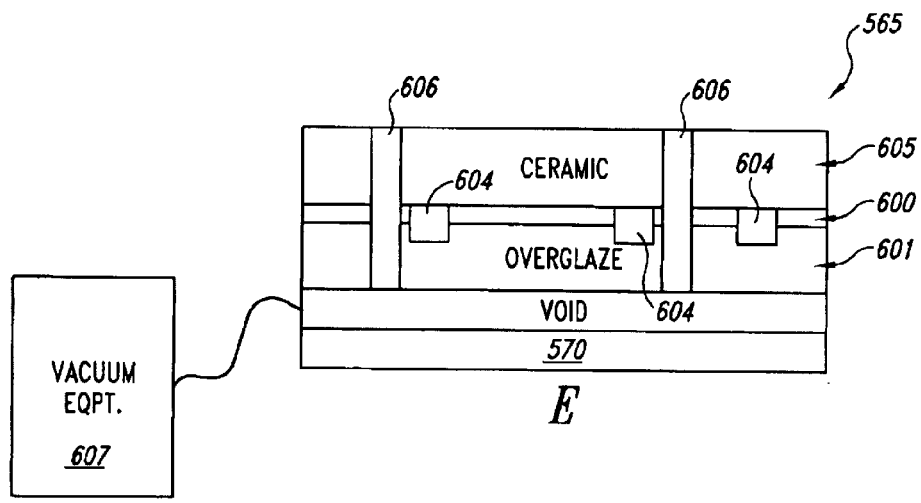
Figure 3:
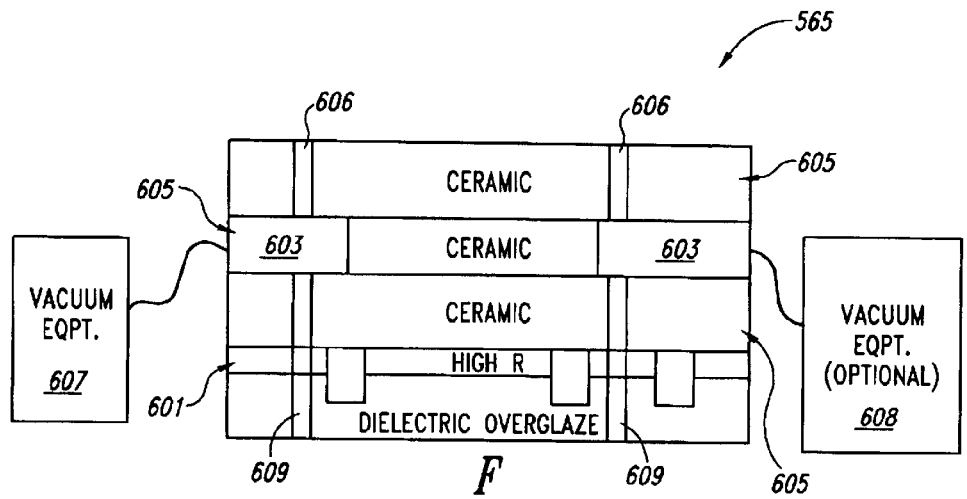
Figure 3:
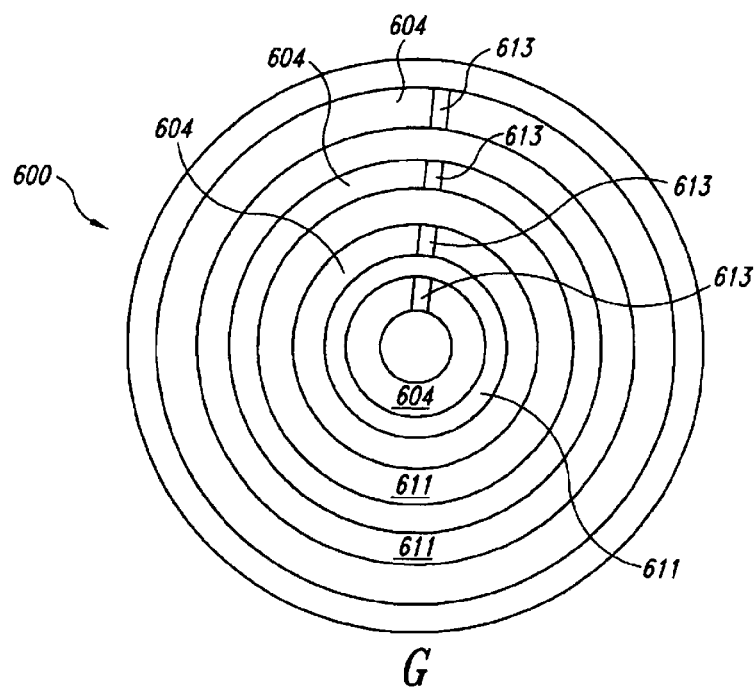
Figure 3:
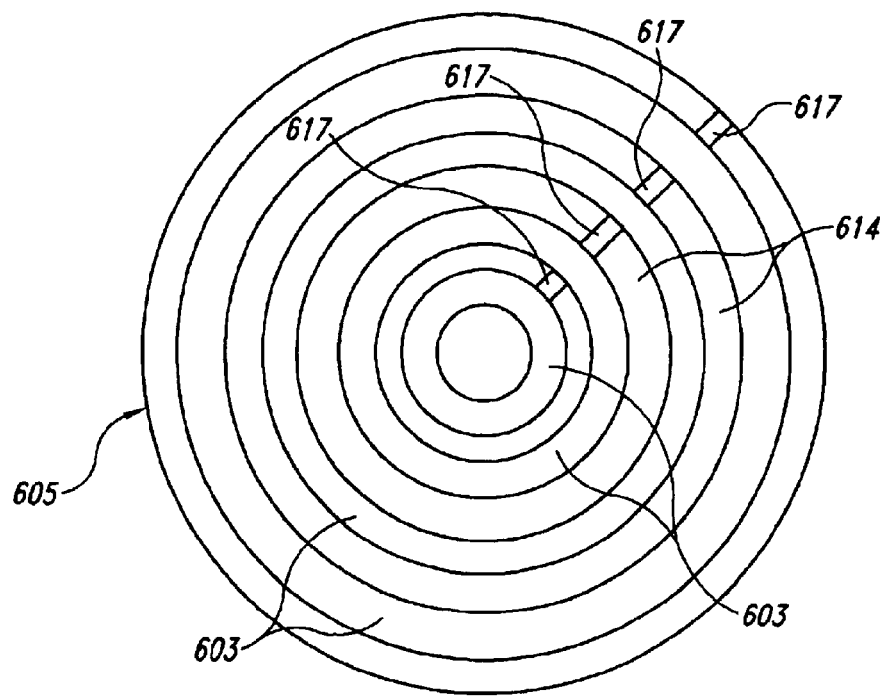
Figure 3:
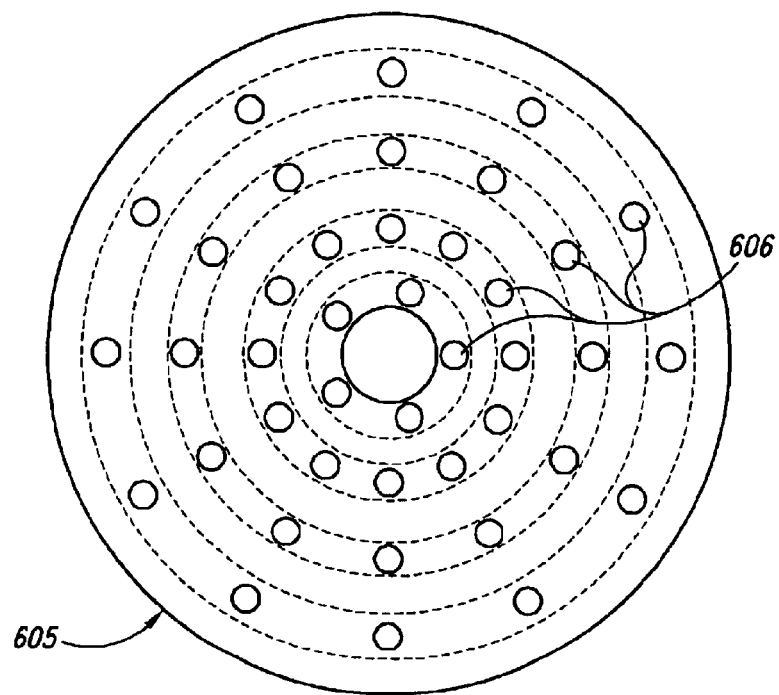
Figure 3:
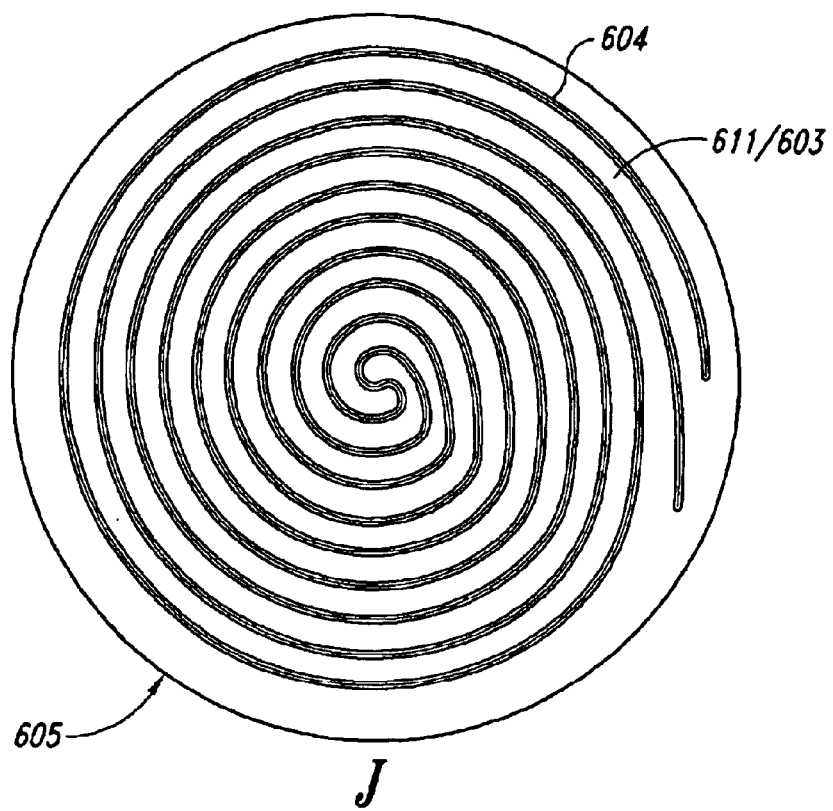
Figure 4:
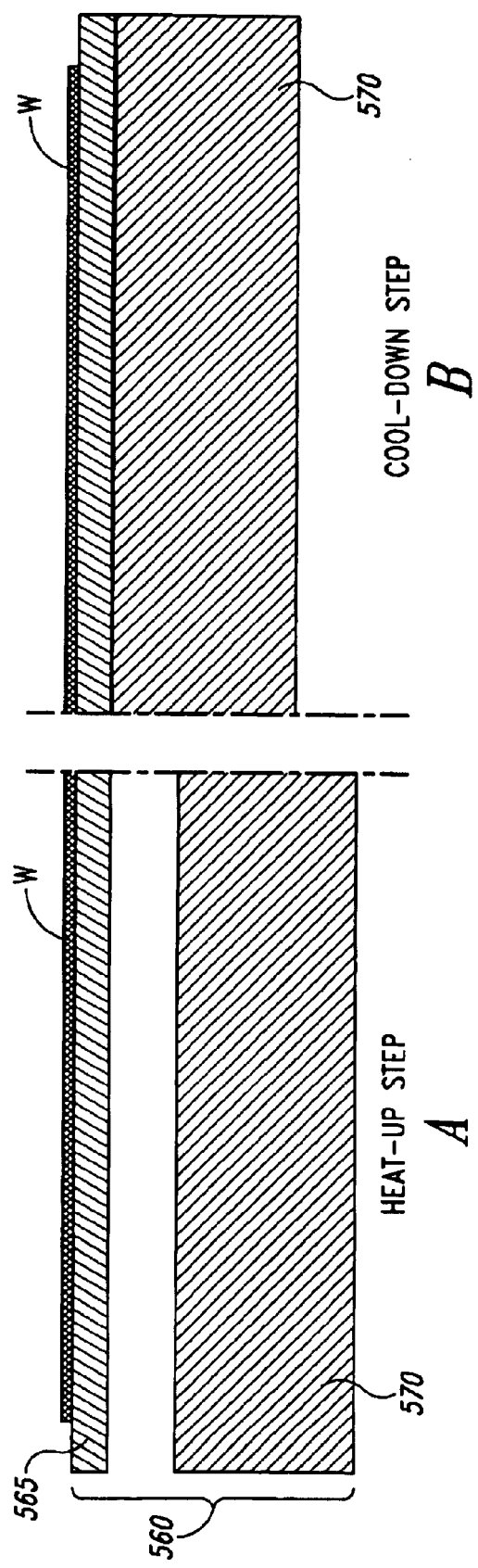
Figure 5:
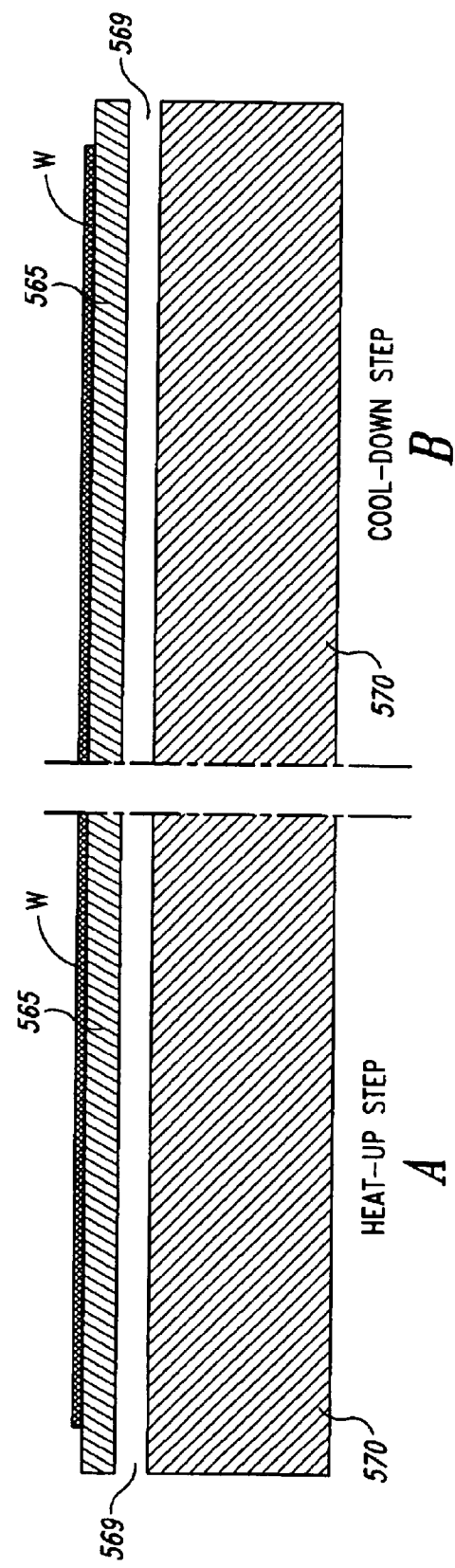
Figure 6:
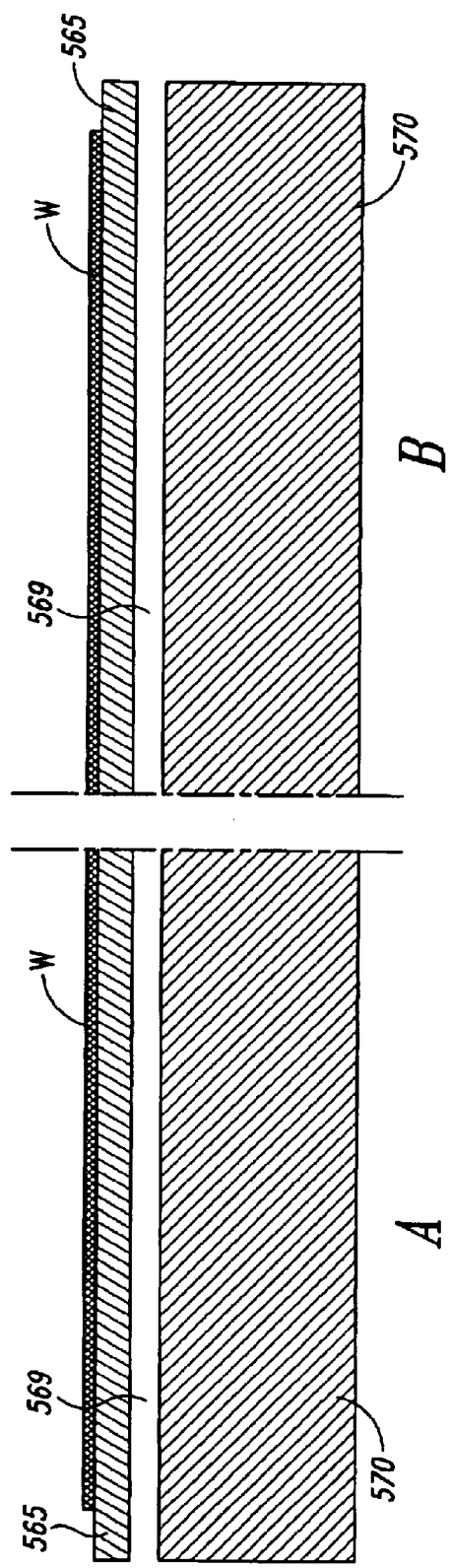
Figure 7:
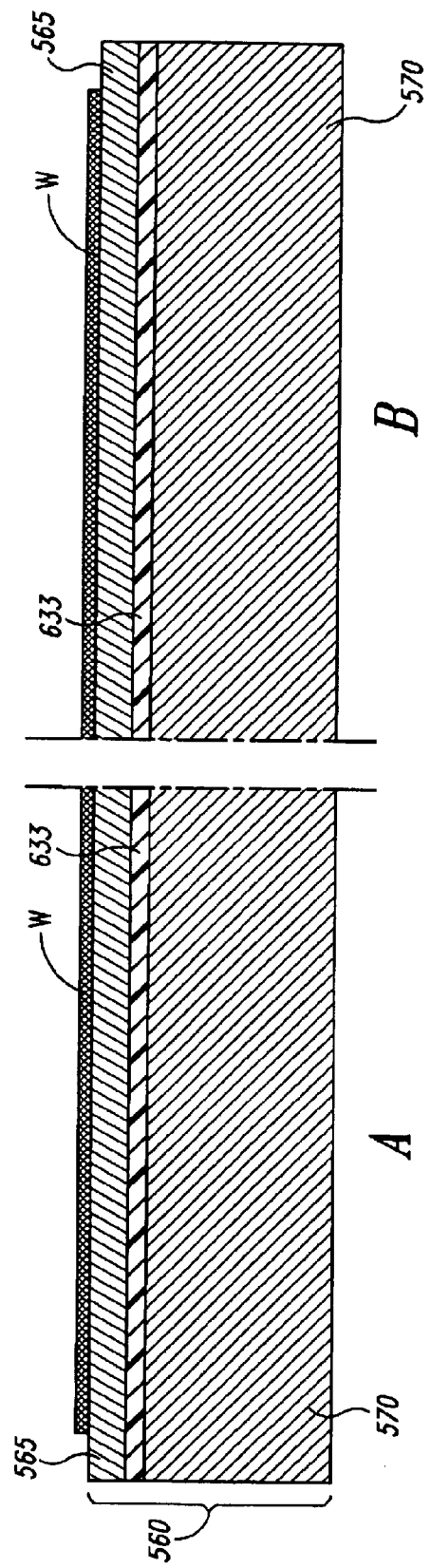

FIGS. 2A and 2B illustrate a thermal reactor, shown generally at 500, that is constructed in accordance with one embodiment of the present invention. The thermal reactor 500 can include a first assembly 505, a second assembly 510, and one or more actuators 515 that are connected to provide relative movement between the first assembly 505 and second assembly 510. The configuration of the thermal reactor 500 shown here may be constructed to occupy a smaller amount of space than some conventional arrangements, which can improve the versatility of the reactor.

In one illustrated embodiment, the second assembly 510 can include one or more components 525 that are adapted to receive a single workpiece W from an automated workpiece transfer mechanism, such as a robot having an end effector that can grasp and release the workpiece W. To this end, the second assembly 510 may include a second assembly housing 550 having an upper rim from which one or more workpiece support members 525 extend. The workpiece support members 525 may take on a number of different forms. For example, a single workpiece support member 525 may be formed as a continuous ring having a lip or the like upon which the workpiece W is set by the workpiece transfer mechanism. Alternatively, a plurality of workpiece support members 525 may be in the form of discrete fingers disposed at various angular positions corresponding to the peripheral edge of the workpiece W, the angular positions being chosen to ensure access by the workpiece transfer mechanism. Other configurations for the workpiece support may likewise be suitable.

The second assembly 510 can have an interior region in which a thermal transfer unit 560 is disposed. The thermal transfer unit 560, in turn, can include a heater 565 and a heat sink 570, the operation of which will be set forth in further detail below. In certain aspects of this embodiment, the heater 565 preferably has a relatively low thermal mass so that its temperature response time is fast enough for thermally processing the workpiece W within a reasonably defined time period. In a further aspect of this embodiment, the heat sink 570 preferably has a relatively high thermal mass when compared to the heater 565 so that the heat sink 570 can cool the heater 565 (as will be set forth below) within a reasonably defined time period. In a still further aspect of this embodiment, the thermal capacity of the heat sink 570 can be greater than the sum of the thermal capacities of the heater 565 and the workpiece W. The heat sink 570 can also include a highly thermally conductive material, such as copper. As used herein, the term thermal mass refers to the product of material density and specific heat, and the term thermal capacity refers to the product of the thermal mass and the material volume.

As noted, the actuator 515 provides relative movement between the first assembly 505 and the second assembly 510. In the illustrated configuration, the actuator 515 is connected to move the first assembly 505 to and from engagement with the second assembly 510. More particularly, the actuator 515 can include a lower portion 530 that is in fixed positional alignment with the second assembly 510 since both are secured to a common deck 535. A transversely extending arm 540 can extend from an upper portion 545 of the actuator 515 and engages the first assembly 505. The actuator 515 can be configured to drive the transversely extending arm 540 and the first assembly 505 between a first position in which the workpiece W can be loaded onto the second assembly 510 by an automated workpiece transfer mechanism (not shown), and a second position in which the first assembly 505 and second assembly 510 are disposed proximate one another to form a space or chamber in which the workpiece W is processed.

In operation, the actuator 515 can initially drive the first assembly 505 to the first position, as illustrated in FIG. 2A. While in this position, the workpiece W can be placed onto the workpiece support members 525 of the second assembly 510 by an automated workpiece transfer mechanism, such as an articulated robot having an end effector carrying the workpiece W.

Once the workpiece W has been loaded onto the workpiece supports 525, the actuator 515 can drive the first assembly 505 toward the second assembly 510 to the second position illustrated in FIG. 2B. The workpiece support members 525 translate congruently with the first assembly 505, through contact with the lower surface of the first assembly 505 or through independent actuation. As illustrated in FIG. 2B, the workpiece W is deposited directly onto the surface of thermal transfer unit 560, where it will be thermally processed. Generally, the upper surface of workpiece W will be the device side of the workpiece while the non-device, lower surface of workpiece W will be placed in contact with the upper surface of thermal transfer unit 560. Alternatively, the orientation of the workpiece W can be inverted. To secure workpiece W to the upper surface of thermal transfer unit 560 during processing, thermal transfer unit 560 may include one or more apertures (described in detail below) that are connected to a vacuum source that draws the lower surface of workpiece W against the upper surface of thermal transfer unit 560.

In the position shown in FIG. 2B, the lower portion of a first assembly housing 520 may engage the upper portion of the second assembly housing 550 to form a thermal processing chamber 555, which may or may not be generally gas-tight. When the thermal reactor 500 is used, as here, for annealing the workpiece, the thermal processing chamber 555 can be continuously purged with an inert gas to minimize the level of any oxidizing agents that may form an undesirable oxide with the copper. To facilitate this purge, the first assembly 505 may be provided with one or more gas inlet ports 580 and one or more gas outlet ports 585. The gas inlet port 580 may open to a manifold in the housing 520 that, in turn, opens to a plurality of holes disposed through a lower surface of housing 520. Gas mixtures that are particularly suitable for reducing oxidizing agents in the processing chamber 555 include nitrogen or hydrogen forming gases (5% hydrogen/95% argon). The inert process environment inhibits surface film oxidation of the workpiece W at elevated temperatures, which can be enhanced by the oxygen-gettering effects of hydrogen forming gas. In processes other than annealing, ports 580 and 585 may be used to provide an inlet and outlet for other gases used to process workpiece W.

Other features may be incorporated into the thermal reactor 500 to make it particularly well-suited for single workpiece annealing. For example, the volume of the processing chamber 555 formed by the cooperation of the first assembly 505 and second assembly 510 may be relatively small, which makes it more efficient to purge and, thereby, reduces the consumption of high-purity, inert process gas. In addition, the first assembly 505 may be provided with one or more cooling fluid inlet ports 612 and one or more cooling fluid outlet ports 617 that provide a flow of cooling fluid to a lower surface of the housing 520 proximate to the workpiece W that, in turn, assists in cooling the workpiece W. Still further, the first assembly housing 520 may contain internal flow channels for re-circulating fluid, to maintain the lower surface of the housing 520 at a specified temperature.

It will be recognized that various fluid inlet and outlet ports may also be affixed to the second assembly 510. For example, fluid ports may be affixed to the second assembly 510 for use in connection with the heat sink 570. More particularly, a flow of cooling fluid may be provided directly to the heat sink 570 or to other structures of the second assembly for cooling of the heat sink 570. Furthermore, one or more exhaust ports may be disposed in the second assembly 510 for supplying and/or venting process gases. This arrangement in which the ports are affixed to the second assembly 510 has the benefit of reducing the amount of movement imparted to the ports and corresponding connectors, thereby increasing in the overall reliability of the corresponding connections.

FIGS. 2C and 2D illustrate a further embodiment of a thermal reactor constructed in accordance with the present invention. In many respects, this embodiment is somewhat similar to the embodiment set forth above in connection with FIGS. 2A and 2B. It differs, however, in that the workpiece supporting components are disposed on the first assembly 505 as opposed to the second assembly 510. Accordingly, an automated robot servicing the thermal reactor embodiment of these figures can be controlled to place and remove the workpiece to and from the first assembly 505 when the first and second assemblies are in the relative workpiece loading position.

In each of the foregoing reactor embodiments, once the workpiece W is secured to the thermal transfer unit 560 and the processing chamber 555 has been purged, the heater 565 of thermal transfer unit 560 can be directed to ramp up to the target process temperature. In one aspect of these embodiments, heating power is provided to the heater 565 in the form of electrical energy by a controller using one or more temperature feedback signals for closed-loop control. The workpiece W is then held at the processing temperature for a specified length of time. After the expiration of the specified length of time, power is shut off to the heater 565 and the heat sink 570 is engaged. In accordance with one manner in which the cooling process takes place, the heat sink 570 remains engaged until the temperature drops below a predetermined temperature threshold, such as 70 degrees Celsius, after which the heat sink 570 may be disengaged. As such, the workpiece W can be cooled to a temperature that allows it to be safely handled by the workpiece transfer mechanism as well as in subsequent processing chambers. Further, the workpiece W can be cooled to a temperature at which the electroplated metal is less susceptible to oxidizing agents in the ambient atmosphere before it is removed from the inert atmosphere of the processing chamber 555.

Upon completion of the cool-down cycle, the vacuum circuit that is used to secure workpiece W against thermal transfer unit 560 can be deactivated and the actuator 515 can drive the first assembly 505 back to the position illustrated in FIG. 2A or FIG. 2C, depending on the particular embodiment. As the first assembly 505 is raised in the embodiment of FIGS. 2A and 2B, the workpiece support members 525 naturally engage or are otherwise directed to engage and lift workpiece W from the surface of the thermal transfer unit 560. The automated workpiece transfer mechanism then removes workpiece W from workpiece support members 525, thereby leaving the thermal reactor 500 ready for accepting and processing another workpiece W. While the thermal reactor 500 is waiting to accept another workpiece W, the heater 565 may be directed to begin ramping to the desired processing temperature, or some intermediate temperature, to thereby reduce the overall time required to thermally process the next microelectronic workpiece. Similarly, the workpiece support members 525 of the embodiment shown in FIG. 2C can be directed to release the workpiece W to the automated workpiece transfer mechanism thereby leaving the reactor 500 in a state in which it is ready to receive another workpiece.

FIGS. 3A–3F illustrate different embodiments of the heater 565, employing different substrate configurations. In one embodiment, the heater 565 is constructed as a thick film heater (i.e., a heater that is constructed using thick film patterning techniques) having a low thermal mass. Each thick film heater 565 configuration can accommodate a high power density within a thin physical profile, resulting in a low thermal mass with fast thermal response (i.e., faster heating and cooling). Given the low thermal mass of such thick film heater configurations, the thick film heater 565 can be thermally isolated from other structures in the second assembly 510, in one aspect of this embodiment.

FIG. 3A illustrates a basic thick film heater. As shown, the thick film heater 565 includes a high resistance layer 600 that is disposed between two ceramic substrate layers 605.

FIG. 3B illustrates further details of one embodiment of the thick film heater 565. As shown, the thick film heater 565 may be fabricated by forming a layer 600 having a circuit pattern of high resistance traces 604 between two or more thin ceramic substrates 605, with optional vacuum distribution circuit channels 603 embedded between the high electrical resistance traces 604. When employed, the vacuum distribution circuit channels 603 are connected to an exterior vacuum supply 607. The high resistance traces 604 may be formed in a pattern that tailors the power distribution to the shape of the microelectronic workpiece so that the workpiece is uniformly heated. The optional vacuum circuit channels 603 are connected to apertures 606 in the top substrate layer, thereby providing suction to the lower surface of the microelectronic workpiece. The embodiments illustrated in FIGS. 3A and 3B are particularly suited for those instances in which a ceramic interface is desired between the heater 565 and the heat sink 570.

FIG. 3C illustrates a third manner in which the thick film heater 565 may be constructed. As shown, the thick film heater 565 may be fabricated with two or more layers of thin ceramic substrate 605 that sandwich a layer of vacuum circuit channels, with a layer of high electrical resistance traces 600 deposited onto the bottom surface of the thick film heater 565. A layer of dielectric overglaze 601 is deposited over the high electrical resistance traces 604 for protection and electrical isolation. Optionally, another dielectric coating 601a can be disposed between the layer of high electrical resistance traces 600 and the adjacent ceramic substrate 605 to improve the adhesion between the ceramic substrate 605 and the layer 600. This embodiment can be relatively easy to manufacture because the vacuum distribution channels 603 may be cut completely through the second ceramic layer 605 and the rear side thereof may be sealed by a lower, adjacent ceramic layer.

FIG. 3D illustrates a fourth manner in which the thick film heater 565 may be constructed. As shown, thick film heater 565 may be fabricated with three or more laminated layers of thin ceramic substrate 605 that sandwich a layer of vacuum circuit channels 603 between two or more thin ceramic substrates 605, and a lower layer of high electrical resistance traces 600 between a different pair of ceramic substrates 605. Again, this embodiment is relatively easy to manufacture because the vacuum distribution channels 603 are cut completely through the second ceramic layer and are sealed by a lower, adjacent ceramic layer. Further, this embodiment is particularly well-suited for those instances in which it is desired to have a ceramic interface between the heating chuck 565 and the heat sink 570.

FIG. 3E illustrates a fifth manner in which the thick film heater 565 may be constructed. As shown, thick film heater 565 may be fabricated with one layer of thin ceramic substrate 605, with a layer of high electrical resistance traces 600 deposited onto the bottom surface of the thick film heater 565. A layer of dielectric overglaze 601 can be deposited over the high electrical resistance traces 604 for protection and electrical isolation.

The void between the bottom surface of the thick film heater 565 and the top surface of the heat sink 570 serves as a vacuum reservoir for the apertures 606 that extend through the thick film heater 565.

FIG. 3F illustrates an embodiment of heater 565 that may be used to provide good thermal contact between the upper surface of heater 565 and the workpiece W during a heating cycle and the lower surface of the heater 565 and the heat sink 570 during a cooling cycle. To this end, the second of the ceramic layers 605 is provided with at least one set of vacuum distribution channels 603. The vacuum distribution channels 603 are in fluid communication with one or more apertures 606 disposed through the upper ceramic substrate that is used to contact the workpiece W. The vacuum distribution channels 603 are also in fluid communication with one or more apertures 609 disposed through a lower surface of the heater 565. Vacuum equipment 607 operates during both the heating and the cooling cycles. During the cooling cycle, the vacuum provided through apertures 609 assists in establishing thermal contact between the lower surface of the heater 565 and the heat sink 570.

Alternatively, separate vacuum distribution channels 603 may be connected to separately operable vacuum sources 607 and 608. In this embodiment, a first vacuum source and corresponding vacuum distribution channels can bring the workpiece W into firm thermal contact with the upper surface of the heater 565 while a second vacuum source and corresponding vacuum distribution channels can bring the heat sink 570 into firm thermal contact with the lower surface of the heater 565 during a cooling cycle.

FIGS. 3G–3J are exemplary plan views of various elements used in the thick film heaters shown in FIGS. 3B–3F. FIG. 3G is a plan view of an exemplary layout for the high resistance layer 600. As illustrated, the exemplary layout includes a plurality of concentric high resistance traces 604 that are separated from one another by corresponding concentric isolation regions 611. The isolation regions 611 may include a dielectric material, such as ceramic or air. When air is used as the dielectric material, the isolation regions 611 can define the vacuum distribution channels 603 of an embodiment such as the one illustrated in FIG. 3B. Each of the high resistance traces 604 can include electrical nodes that are isolated from one another by corresponding isolation regions 613. The isolation regions 613 may include a dielectric material, such as ceramic or air. Additionally, the high resistance traces 604 may be provided with power on an individual basis, or may be provided with power supplied on a common power bus.

FIG. 3H is an exemplary plan view of the layout of vacuum distribution channels 603 formed in the second ceramic layer 605 such as the one illustrated in FIGS. 3C, 3D and 3F. Again, the vacuum distribution channels 603 are formed in a concentric arrangement and are generally isolated from one another by corresponding isolation regions 614. The isolation regions 614 can include one or more fluid passage channels 617 that provide areas of fluid communication between the distribution channels 603 so that the vacuum provided by a vacuum source connected to one or more of the distribution channels 603 may be communicated to all of the distribution channels.

FIG. 3I is a top plan view of an exemplary layout for the uppermost ceramic layer 605. As illustrated, apertures 606 may be formed in the upper ceramic layer 605 at locations disposed immediately above the vacuum flow channels 603 (shown in phantom outline). With respect to the exemplary layout shown here, the apertures 606 are arranged in concentric circles at equal angular intervals.

FIG. 3J illustrates a further configuration for the high resistance traces 604. As shown, the traces 604 are organized in the form of a continuous spiral separated by a isolation regions 611 that, as noted above, can be formed from a solid dielectric material or air. When air is employed, regions 611, in certain of the foregoing embodiments, can function as the vacuum flow channels 603.

FIGS. 4A–7B illustrate various embodiments of the thermal transfer unit 560 employing different interfaces between the thick film heater 565 and the heat sink 570. In an embodiment shown in FIGS. 4A and 4B, solid/solid conduction is used as the primary mode of heat transfer from the thick film heater 565 to the heat sink 570 as well as for the heat transfer between the heater 565 and the workpiece W. During thermal processing of the workpiece W, the thermal transfer unit 560 is in the heating state illustrated in FIG. 4A. In the heating state, the top surface of the heat sink 570 can be offset from the lower surface of the thick film heater 565 and the volume between them can be filled with a relatively low thermal conductivity gas, such as nitrogen, which thermally insulates the elements from one another. Isolating the thick film heater 565 from the heat sink 570 in this manner can facilitate a fast heat up to the desired process temperature, because there is minimal heat loss. The cooldown state is illustrated in FIG. 4B. In this state, the thick film heater 565 is deactivated and the thick film heater 565 and heat sink 570 are moved relative to one another so that the lower surface of thick film heater 565 engages the upper surface of heat sink 570. Such relative movement may be provided, for example, by opposing inflatable, flange seals that are actuated to impart vertical movement to the heat sink 570.

FIGS. 5A and 5B illustrate an embodiment of the thermal transfer unit 560 in which solid/gas/solid conduction is used as the primary mode of heat transfer from the thick film heater 565 to the heat sink 570. In this embodiment, the thick film heater 565 and the heat sink 570 are permanently offset from one another by a very small distance (i.e., 0.020 inches). While in the heating state illustrated in FIG. 5A, the volume 569 between the thick film heater 565 and the heat sink 570 is purged with a relatively low thermal conductivity gas to thermally insulate the elements from one another. When in the cooling state illustrated in FIG. 5B, the thick film heater 565 is deactivated and the volume 569 between the thick film heater 565 and the heat sink 570 is purged with a relatively high thermal conductivity gas, such as helium, which serves as the medium for conducting heat from the thick film heater 565 to the heat sink 570. This approach provides efficient use and transfer of thermal energy, with no moving parts. Notably, inlet and outlet ports for the gases must be provided in the thermal reactor 500.

FIGS. 6A and 6B illustrate an embodiment of the thermal transfer unit 560 that makes use of forced convection and boiling as the primary modes to transfer heat from the thick film heater 565 to the heat sink 570. Again, the thick film heater 565 and the heat sink 570 are permanently offset from one another by a small distance (i.e., 0.020–0.040 inches). While in the heating state illustrated in FIG. 6A, the volume 569 between the thick film heater 565 and the heat sink 570 is purged with a relatively low thermal conductivity gas to thermally insulate the elements from one another. When in the cooling state illustrated in FIG. 6B, the thick film heater 565 is deactivated and the volume 569 between the heating chuck 565 and the heat sink 570 is filled with an impinging, high-speed flow of heat transfer fluid (ie., water or glycol), which serves as the medium for convecting heat away from the thick film heater 565 to the heat sink 570. The heat sink 570 in this instance may be formed to serve as a sparger shower assembly, uniformly delivering the heat transfer fluid through a manifold of flow jet apertures in the upper surface of the heat sink, and locally draining the fluid through an interspersed manifold of exit holes. Alternatively, spent cooling fluid may be directed to exit radially in the channel between the heating and heat sinks. This overall approach provides efficient use and transfer of thermal energy, again with no moving parts.

FIGS. 7A and 7B illustrate yet a further embodiment of the thermal transfer unit 560. In this embodiment, the workpiece W, the thick film heater 565 and the heat sink 570 are in constant contact during the entire thermal processing cycle. A thin layer of insulating material 633 is used to thermally insulate the thick film heater 565 from the heat sink 570. The material used for the layer 633 and the thickness thereof are chosen to yield an optimal balance between the performance of the thermal transfer unit 560 that is exhibited during the heating and cooling sub-cycles of the overall thermal processing cycle. This design offers the advantage of design simplicity, in that there are no moving parts and no thermally insulating/conducting gases needed.

In each of the foregoing embodiments in which the heat sink 570 directly contacts the heater 565, an optional, high thermal conductivity material may be disposed between the contact surfaces during the cooling cycle. The material disposed between the contact surfaces preferably is resiliently deformable in response to the pressure applied when the heater 565 and heat sink 570 are in direct thermal contact with one another. In this way, a more uniform thermal transfer medium exists between the heater 565 and heat sink 570 since air pockets or the like that may otherwise occur if the heater 565 and heat sink 570 surfaces were in direct physical contact are substantially eliminated.

Figure 8:
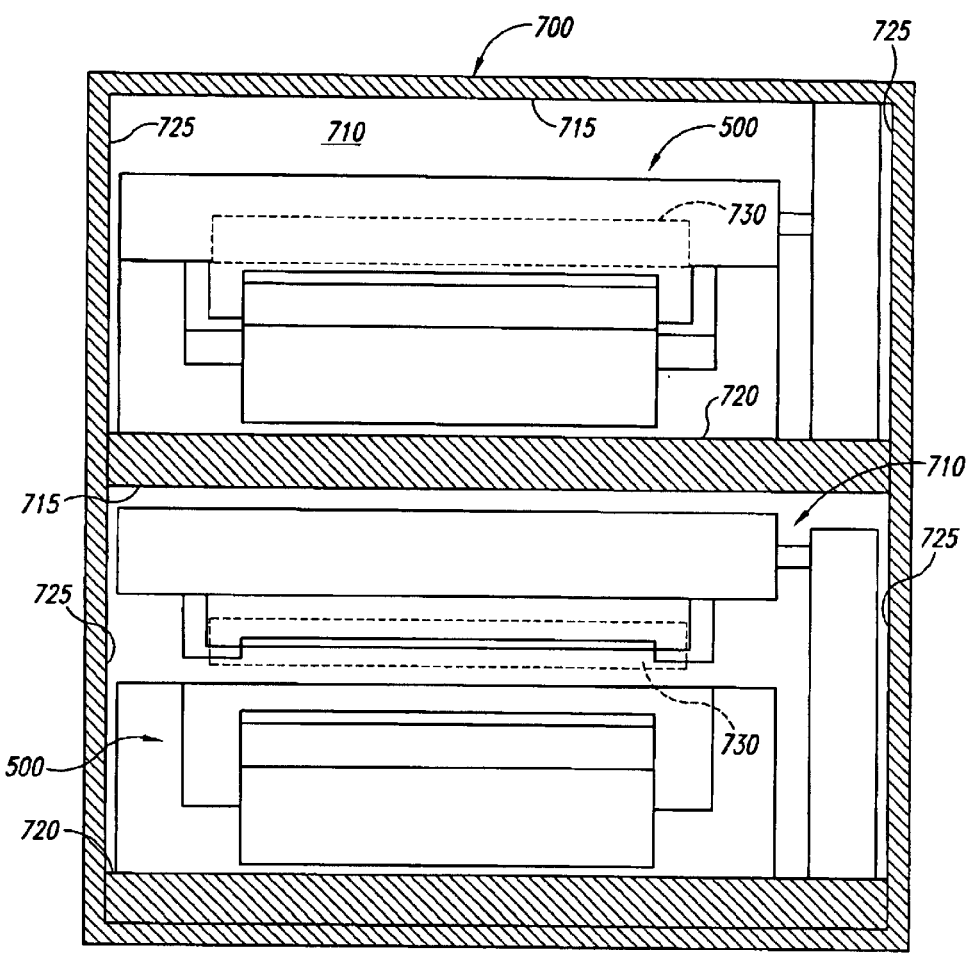
FIG. 8 illustrates one manner in which a plurality of thermal reactors of the type shown in FIGS. 2A–2D may be integrated into a single annealing station.

FIG. 8 illustrates one manner in which two or more thermal reactors constructed in accordance with one or more of the foregoing embodiments may be consolidated at a single annealing station. In this embodiment, the thermal reactors are disposed in a stacked configuration within a housing unit 700. Housing unit 700 includes a plurality of chamber units 710, each including a single thermal reactor. The chamber units 710 are defined by upper and lower horizontal walls 715 and 720, and one or more sidewalls 725. One or more sidewalls 725 of each chamber unit 710 may include an automated door or mail slot opening 730 that isolates each chamber unit 710 from the surrounding environment and provides a workpiece transfer mechanism with access to the thermal reactors during workpiece loading and unloading operations.

Figure 9:
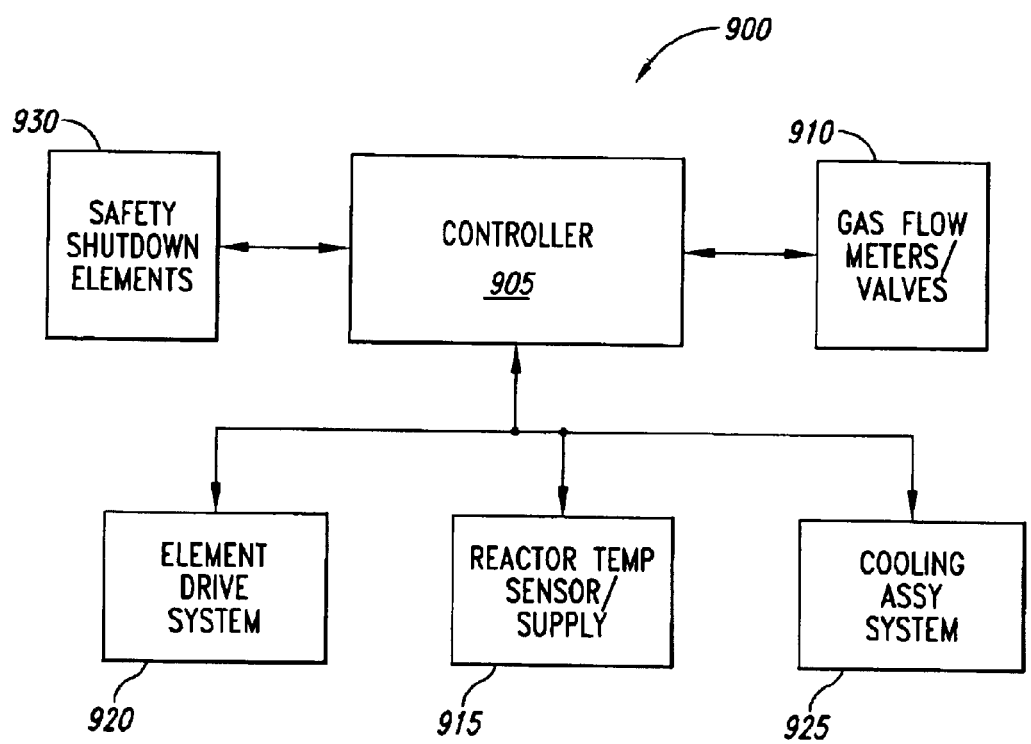
FIG. 9 illustrates one embodiment of a programmable control system that may be used to coordinate the operation of the thermal reactor.

FIG. 9 is a schematic block diagram of one embodiment of a programmable control system that may be used to control the thermal reactor assembly in accordance with a further aspect of the present invention. The control system, shown generally at 900, can include a programmable controller 905, such as a programmable logic controller, microcontroller, microprocessor, etc. The controller 905 receives data and communicates data to and from a plurality of peripheral components that are used to monitor and control the thermal reactor. For example, the controller 905 can be in communication with an automated gas flow meters/valve system 910. The automated gas flow meters/valve system 910 controls the flow of various gases, such as the purging gases, that are provided to the thermal reactor. The automated gas flow system 910 may also be used to control the operation of the vacuum equipment 607 and/or 608 shown in FIGS. 3B–3F, turning the equipment on and off at the appropriate times.

Control of the annealing temperature within the thermal reactor may also be controlled by the controller 905 through a corresponding interface with a reactor temperature sensor/supply system 915. The reactor temperature sensor/supply system 915 can include a plurality of temperature sensors that monitor the temperature within the thermal reactor. The system 915 can also include a power supply that provides the necessary electrical power to the electrical traces 604 (FIGS. 3A–3F) of the high resistance layer in response to data communicated from the controller 905. Various known temperature control algorithms may be employed within the programmable controller 905 to facilitate this function.

Element drive system 920 and chuck cooling assembly 925 can operate the drive 530 (FIGS. 2A–2D) and the heat sink 570, respectively. More particularly, drive system 920 can operate the drive 530 to move the first and second assemblies 510, 520 with respect to one another for loading/unloading and processing of the workpiece W in response to commands received from programmable controller 905. The drive system 920 may also communicate positional information to the controller 905 indicative of the relative position of the first and second assemblies 510, 520, which may be used by the controller 905 to properly position the assemblies during operation of the thermal reactor.

Cooling assembly system 925 may serve a dual purpose. First, the system 925 may be used to control the relative movement between the heater and the heat sink 570 in response to commands received from the controller 905. Further, system 925 may be used to control the temperature of the heat sink 570 by controlling the cooling gases provided to the heat sink in response to commands received from the controller 905. To this end, system 925 may also include one or more temperature sensors that monitor the temperature of the heat sink 570 and transmit data to the controller 905 indicative of this temperature. The controller 905 may then use this temperature information to direct system 925 to cool the heat sink 570 to the target temperature.

Controller 905 also communicates with one or more safety shutdown elements 930. The safety shutdown elements 930 are activated by the controller 905 when the controller detects one or more conditions that compromise the safety of the thermal reactor. For example, the safety shutdown elements 930 may be used by the controller 905 to shutdown the thermal reactor system in response to an over temperature condition of the heating chuck, reactor chamber, etc. It will be recognized in view of these teachings that other safety conditions may also be detected by the controller 905 pursuant to activation of the safety shutdown elements 930.

Figure 10:
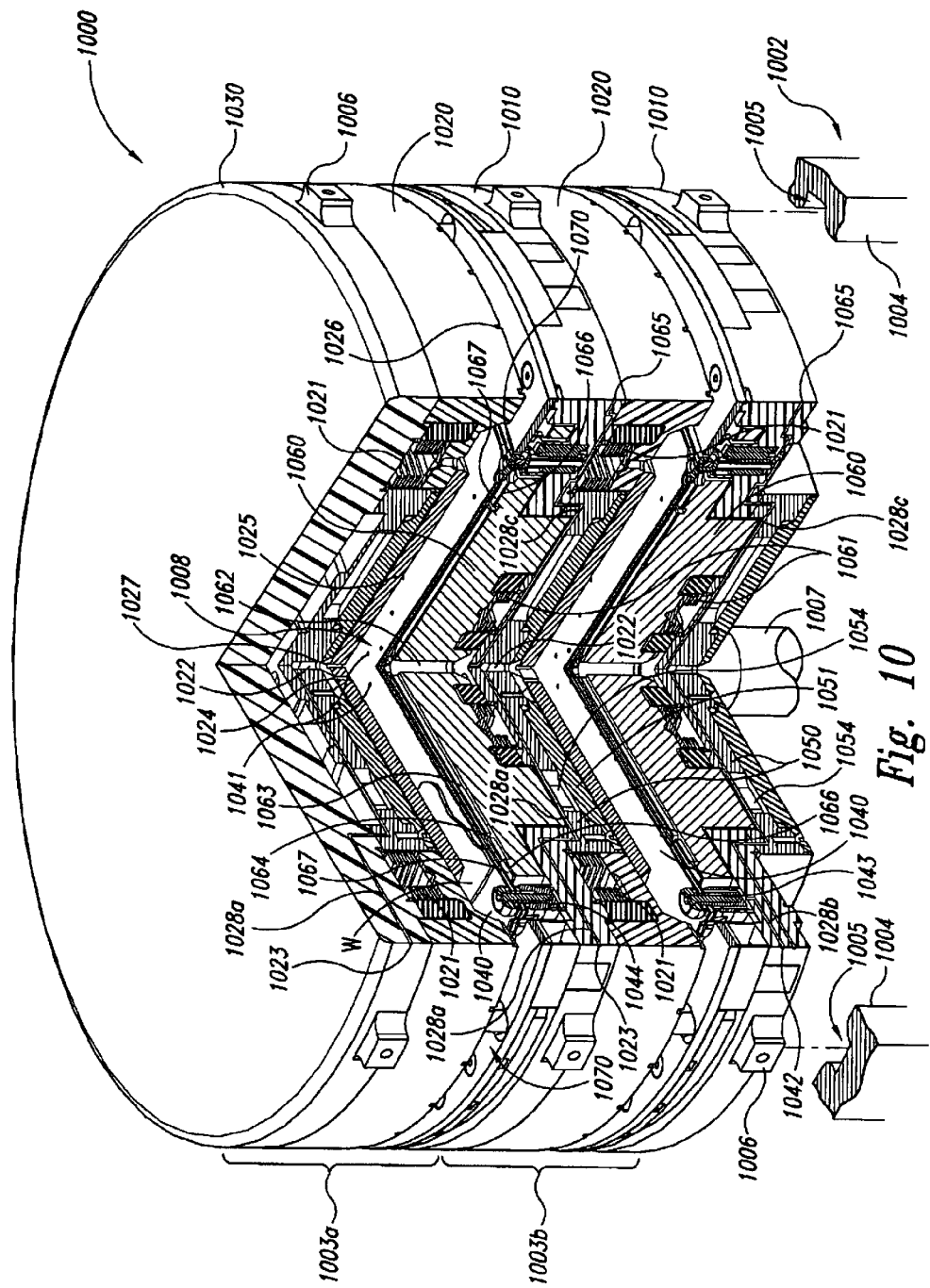
FIG. 10 is a partially schematic, partially cut-away, side isometric view of an apparatus for annealing microelectronic workpieces in accordance with an embodiment of the invention.

FIG. 10 is a partially schematic, partially cut-away, side isometric view of an apparatus 1000 for thermally processing microelectronic workpieces W in accordance with another embodiment of the invention. In one aspect of this embodiment, the apparatus 1000 includes two thermal processing chambers 1003 (shown as an upper chamber 1003*a* and a lower chamber 1003*b*) supported by an apparatus support 1002. Each chamber 1003 can have a base 1010 and lid 1020 that moves toward and away from the base 1010 to close and open the chamber 1003. The workpiece W can be supported within the chamber 1003 on a plurality of workpiece supports 1070. In one aspect of this embodiment, the apparatus 1000 can anneal a selected material (such as copper or another metal) of the workpiece W. Alternatively, the apparatus 1000 can perform other elevated temperature processes, as described in greater detail below. When the apparatus 1000 both heats and cools the workpiece W, the supports 1070 can lower the workpiece W into engagement with a heat source 1040 during a heating phase of the process. During a cooling phase of the process, a first heat sink 1060 can rise to engage an opposite surface of the heat source 1040 to cool both the heat source 1040 and the workpiece W. After the cooling phase, the first heat sink 1060 can descend to engage a second heat sink 1050 where the first heat sink 1060 is cooled in preparation for another cycle. The lid 1020 can then move away from the base 1010 and the workpiece W can be removed. In a preferred aspect of this embodiment, the heat source 1040 is positioned between the workpiece W and the first heat sink 1060, with the first heat sink 1060 positioned beneath the heat source 1040.

In one embodiment, the support 1002 of the apparatus 1000 can include a frame defined by a plurality of columns 1004 (two of which are visible in FIG. 10), each having a receiving channel 1005. The chambers 1003 can be fixedly attached to the columns 1004 by inserting tabs 1006 extending outwardly from the base 1010 of each chamber 1003 into the corresponding channels 1005 and fastening the tabs 1006 to the columns 1004. Accordingly, the chambers 1003 can remain fixed while a transfer mechanism 620 moves in the vertical direction to selectively place a single microelectronic workpiece W in either the upper chamber 1003*a* or the lower chamber 1003*b*. Alternatively, the chambers 1003 can be coupled either individually or together to one or more actuators 1007 to move the chambers 1003 vertically in addition to or in lieu of moving the transfer mechanism 620 in the vertical direction.

In a further aspect of this embodiment, the chambers 1003 can have a modular construction. For example, the lid 1020 of the lower chamber 1003*b* can depend from and can be integrated with the base 1010 of the upper chamber 1003*a*. The lid 1020 of the upper chamber 1003*a* can be supported by a cover 1030. Accordingly, any number of chambers 1003 can be stacked one above the other in a manner that reduces the total number of components of the apparatus 1000 by integrating features of one chamber with those of the chamber above. This arrangement can also reduce the footprint required for multiple chambers. At the same time, this arrangement provides the flexibility of a modular construction. In other embodiments, the apparatus 1000 can have other modular arrangements, for example, with the chambers positioned side by side.

The lid 1020 of each chamber 1003 can be coupled to a lid actuator 1021 to move downwardly from an open position (shown in FIG. 10) to a closed position. The lid actuator 1021 of the upper chamber 1003*a* can be attached to the cover 1030, and the lid actuator 1021 of the lower chamber 1003*b* can be attached to the base 1010 of the upper chamber 1003*a*. Each lid actuator 1021 can include an air-activated bellows that moves the lid 1020 downwardly when inflated. In one aspect of this embodiment, each bellows can extend circumferentially for 360° to form a closed circle. Alternatively, a plurality of bellows or other actuators can be disposed at spaced-apart circumferential locations around the lid 1020. In either embodiment, one or more springs (not shown) can return the lid 1020 to the open (upper) position when the air pressure within the bellows is released.

When the lid 1020 is in the closed position, the lid 1020 and the base 1010 define a chamber volume 1008 around the microelectronic workpiece W. As described above with reference to FIG. 2B, it can be advantageous to purge the region around the microelectronic workpiece W during the annealing process. Accordingly, the lid 1020 can include a purge fluid passageway 1022 that transmits a purge fluid (such as nitrogen) to the chamber volume 1008 via a manifold 1027. The manifold 1027 is aligned with a purge fluid diffusion plate 1025 that is perforated with purge fluid apertures 1024 leading directly into the chamber volume 1008. The passageway 1022 can also be coupled to a purge fluid port 1023 via a connecting passage 1028*a*. The purge fluid port 1023 can be connected to a source of purge fluid (not shown). In one embodiment, the purge fluid port 1023 for the upper chamber 1003*a* can be positioned in the cover 1030, and the purge fluid port 1023 for the lower chamber 1003*b* can be positioned in the base 1010 of the upper chamber 1003*a*. The connecting passages 1028*a* for both chambers 1003 can extend laterally outwardly to couple to the purge fluid ports 1023 at the outer surface of the apparatus 1000 and can extend upwardly to avoid interfering with the annular lid actuators 1021. The purge fluid can exit the chamber volume 1008 through purge fluid exit openings 1026 at the outer surface of the apparatus 1000.

During the elevated temperature portion of the annealing process, the microelectronic workpiece W can be engaged with the heat source 1040. Accordingly, the upper surface of the heat source 1040 can include a solid state material that can transfer heat to the microelectronic workpiece by conduction. The heat source 1040 can also include vacuum apertures 1041 coupled to a vacuum source (not shown), as described in greater detail below, to draw the microelectronic workpiece W into close engagement with the heat source 1040 during heating. For example, the heat source 1040 can be supported relative to the base 1010 with a plurality of heat source supports 1044, at least one of which includes a vacuum passage 1043 (shown in the lower chamber 1003*b*) in fluid communication with the vacuum apertures 1041. The vacuum passage 1043 can also be connected (via a connecting passage 1028*b*) to a heater vacuum port 1042 at the outer surface of the apparatus 1000 for coupling to the vacuum source.

During the cooling portion of the annealing process, the first heat sink 1060 can be raised to engage the heat source 1040 and cool both the heat source 1040 and the microelectronic workpiece W by conduction. Accordingly, the first heat sink 1060 can be coupled to a heat sink actuator 1061 that moves the first heat sink 1060 upwardly into engagement with the heat source 1040. In one embodiment, the heat sink actuator 1061 can include an air-driven bellows, generally similar to the lid actuator 1021 discussed above. Alternatively, the heat sink actuator 1061 can have other configurations that move the first heat sink 1060 upwardly into engagement with the heat source 1040 and downwardly out of engagement with the heat source 1040.

In a further aspect of this embodiment, the first heat sink 1060 can include a vacuum supply passageway 1062 connected (via a connecting passage 1028*c*) to a vacuum port 1065 in the outer surface of the apparatus 1000. The vacuum supply passageway 1062 is coupled to one or more radial vacuum channels 1063 and one or more circumferential vacuum channels 1064 in an upper surface of the first heat sink 1060 to draw the first heat sink 1060 into close thermal contact with the heat source 1040 when the heat source 1040 and the first heat sink 1060 are engaged with each other. The upper surface of the first heat sink 1060 can also include a compressible, conductive thermal pad 1066 having an engaging surface 1067 to provide close thermal contact with the heat source 1040 when the first heat sink 1060 is in its raised position. In another aspect of this embodiment, the lower surface of the first heat sink 1060 can include a compressible, conductive thermal pad generally similar to the pad 1066 to improve the thermal contact with the second heat sink 1050.

In one embodiment, the first heat sink 1060 has no active cooling elements. Accordingly, an advantage of this arrangement is that no cooling fluid supply lines are connected to the first heat sink 1060, which can eliminate the complexity associated with fluid couplings attached to a movable heat sink. Instead, the second heat sink 1050 can be actively cooled and can cool the first heat sink 1060 when the first heat sink 1060 is disengaged from the heat source 1040 and engaged with the second heat sink 1050. Accordingly, the second heat sink 1050 can include a cooling channel 1054 coupled to a cooling fluid supply port and a return port described in greater detail below with reference to FIG. 18. The second heat sink 1050 can also include a cooling member cap 1051 that seals and defines, in part, the cooling channel 1054, as is also discussed below with reference to FIG. 18. In an alternate embodiment, the first heat sink 1060 can be actively cooled (for example, with cooling fluid) in addition to or in lieu of actively cooling the second heat sink 1050. Such an arrangement can increase the speed with which the first heat sink 1060 (and/or the heat source 1040 and workpiece W) cools because the first heat sink 1060 can be cooled while it is engaged with the heat source 1040.

Figure 11:
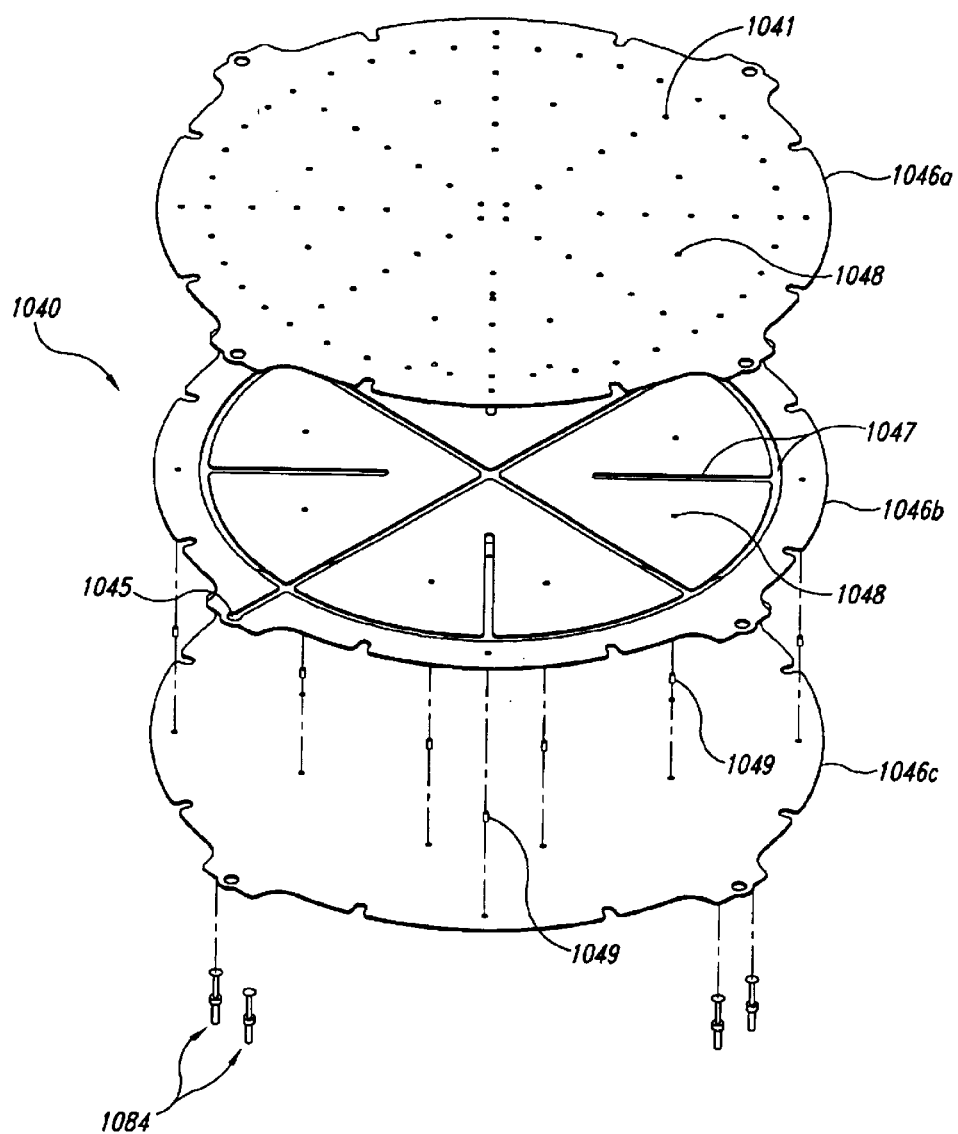
FIG. 11 is an exploded, isometric view of a heat source in accordance with an embodiment of the invention.

FIG. 11 is a partially exploded, side isometric view of an embodiment of the heat source 1040 described above with reference to FIG. 10. In one aspect of this embodiment, the heat source 1040 can include three ceramic plates 1046, shown in FIG. 11 as an upper ceramic plate 1046*a*, an intermediate ceramic plate 1046*b*, and a lower ceramic plate 1046*c*. The upper ceramic plate 1046*a* includes the vacuum apertures 1041 that draw the microelectronic workpiece W (FIG. 10) into close thermal engagement with the heat source 1040. The intermediate ceramic plate 1046*b* can include vacuum channels 1047 that provide fluid communication between the vacuum apertures 1041 and the heater vacuum port 1042 (FIG. 10). At least one of the vacuum channels 1047 includes a coupling port 1045 that aligns with the vacuum passage 1043 of the heat source support 1044 (FIG. 10). The lower ceramic plate 1046*c* includes alignment pins 1049 that extend upwardly through corresponding alignment holes 1048 in the intermediate plate 1046*b* and the upper plate 1046*a* to align the three ceramic plates 1046 with each other. Electrical connectors 1084 engage an electrical element on the lower surface of the lower ceramic plate 1046*c*, as will be described in greater detail below with reference to FIGS. 13 and 16.

Figure 12:
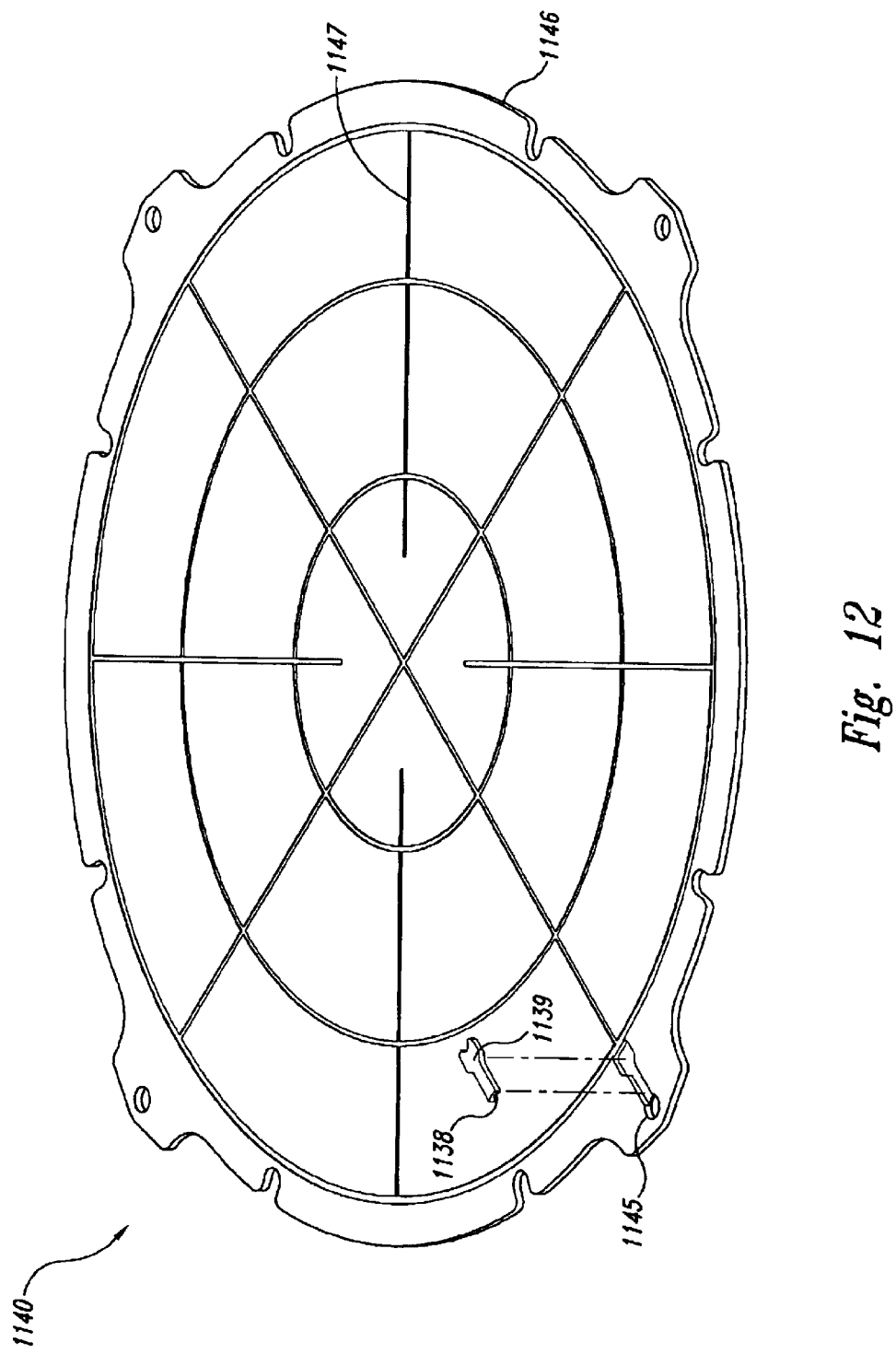
FIG. 12 is a partially exploded, top isometric view of a heat source in accordance with another embodiment of the invention.

FIG. 12 is a top isometric view of a heat source 1140 in accordance with another embodiment of the invention. In one aspect of this embodiment, the heat source 1140 includes a single ceramic plate 1146 having vacuum channels 1147 formed directly in an upper surface of the ceramic plate 1146. At least one of the vacuum channels 1147 includes a channel cover 1139 having one end that defines a coupling port 1145 configured to align with the vacuum passage 1043 described above with reference to FIG. 10. The channel cover 1139 can further include an undersurface having a vacuum groove 1138 that provides fluid communication between the coupling port 1145 and the vacuum channels 1147. The vacuum channels 1147 are exposed directly to the downwardly-facing surface of the microelectronic workpiece W to draw the workpiece W into engagement with the heat source 1140. Accordingly, one feature of the heat source 1140 described above with reference to FIG. 12 is that it can be manufactured from a single ceramic plate 1146, rather than a plurality of such plates. An advantage of this arrangement is that it can reduce manufacturing costs and can increase the reliability of the heat source 1140.

Figure 13:
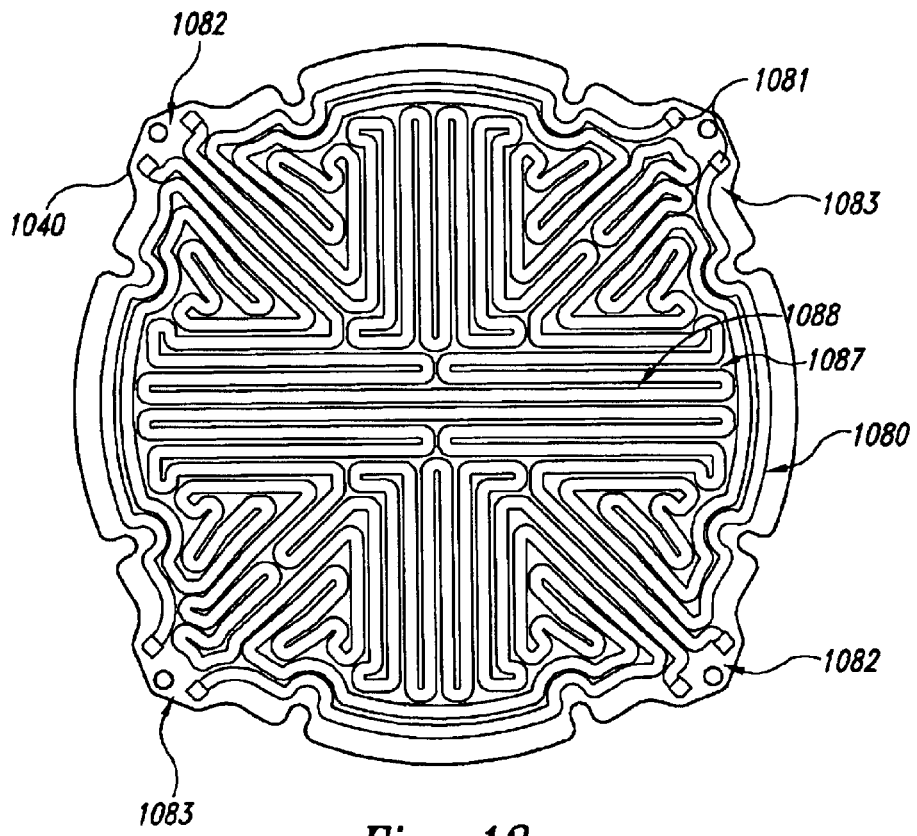
FIG. 13 is a plan view of a resistive heat element in accordance with another embodiment of the invention.

In either of the embodiments of the heat source 1040 and 1140 described above with reference to FIGS. 11 and 12, the heat source can further include a heat generator. For example, as shown in FIG. 13, an electrical element 1080 can be attached directly to and/or formed integrally with a lower surface of the heat source 1040. Accordingly, the electrical element 1080 can supply power to the heat source 1040 more efficiently than some conventional systems, and can be less likely to detach from the heat source 1040. In one aspect of this embodiment, the electrical element 1080 can include separate circuits that independently provide power to an inner region 1088 and an outer region 1087 of the heat source 1040. In one aspect of this embodiment, two inner circuits 1082 supply power to the inner region 1088 and two outer circuits 1083 provide power to the outer region 1087. Each of the circuits 1082, 1083 can include two contact pads 1081 for coupling to a source of electrical power, as described in further detail below with reference to FIG. 16. Accordingly, the electrical element 1080 can be tailored to account for heating rate requirements that may be different for one portion of the microelectronic workpiece W (and the heat source 1040) than for another. For example, when the heat losses at the peripheral regions of the microelectronic workpiece W are greater than the heat losses at the interior of the workpiece W, the outer region 1087 of the electrical element 1080 can be supplied with a greater amount of electrical power per unit area to offset the anticipated heat loss. In other embodiments, the electrical element 1080 (or other heat-generating device) can be tailored to provide differential or uniform heating to the microelectronic workpiece W, depending upon the heat transfer characteristics of the heat source 1040 and/or the microelectronic workpiece W.

Figure 14:
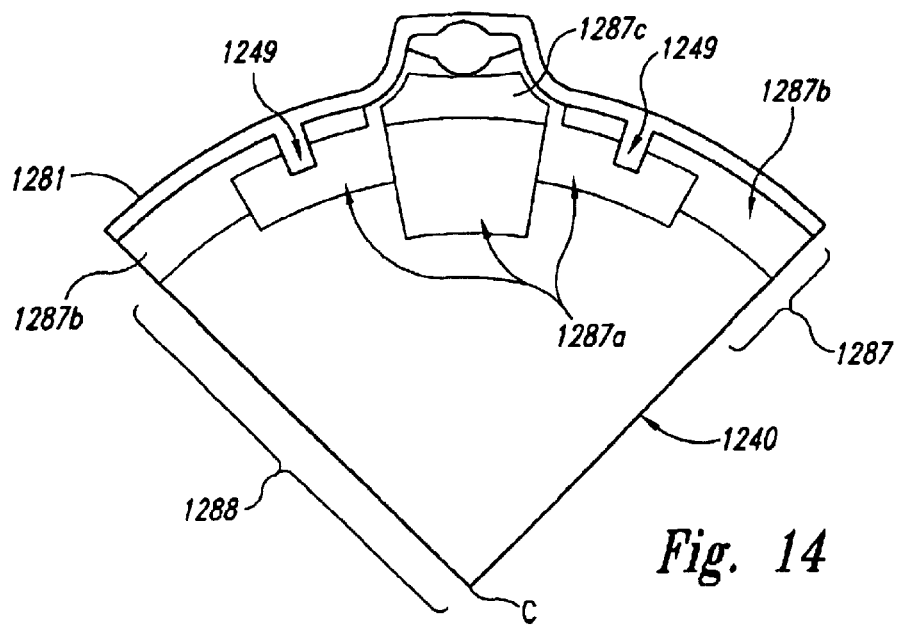
FIG. 14 is a plan view of a heat source having a plurality of heating regions in accordance with another embodiment of the invention.

FIG. 14 is a top plan view of a heat source 1240 with results of a thermal analysis superimposed on the upward facing surface of the heat source 1240. The heat source 1240 is positioned adjacent to a chamber wall 1281 and includes an inner region 1288 and an outer region 1287. The heat source 1240 can further include notches 1249 to accommodate the workpiece supports 1070 (FIG. 10). The results of a thermal analysis completed for an embodiment of the heat source 1240 (with the microelectronic workpiece W positioned against the heat source 1240) indicate that power can be supplied at different rates per unit area of the heat source 1240 to uniformly heat the microelectronic workpiece W. For example, the outer region 1287 can include a central portion 1287a, outlying portions 1287b on each side of the central portion 1287a, and a contact region 1287c proximate to the contact pads of the heat source 1240. In one embodiment, the power per unit area supplied to the outlying portions 1287b can be about 90% of the power per unit area supplied to the central portion 1287a. The power can be electrical power when the heat source 1240 includes a resistive electrical element, or alternatively, the power can be provided by another source. In either embodiment, the power can be proportional to the rate at which heat is supplied to the heat source 1240 and the rate at which heat is transferred to the microelectronic workpiece W. Furthermore, the power per unit area can be supplied to the contact region 1287c can be about 150% of the power per unit area supplied to the central portion 1287a. In other embodiments, the relative values of power supplied to the regions 1287a–1287c can be different, for example, depending upon the particular characteristics of the heat source 1240 and the microelectronic workpiece W engaged with the heat source 1240.

In one embodiment, the power supplied per unit area can vary as a function of distance from the center C of the heat source 1240. For example, the power per unit area can increase in a radial outward direction so that the power at the outer edge of the heat source 1240 is about 7.5% greater than the power per unit area at the center C of the heat source 1240. Accordingly, the power at any local location on the heat source 1240 can be governed by the following equation:

$$P_{local} = P_{center}\left[1 + \alpha \frac{r}{R}\right] \quad [1]$$

where $P_{local}$=the local power per unit area $P_{center}$=the power per unit area supplied to the center of the heat source α=a power increase factor (such as 7.5%)

r=local radius

R=radius at the edge of the heat source.

In one embodiment, α can be about 7.5%, and in other embodiments it can have other values. $P_{local}$ can vary continuously over the entire surface of the heat source 1240, or one or more regions of the heat source 1240 can be supplied with power according to equation 1 above.

Figure 15:
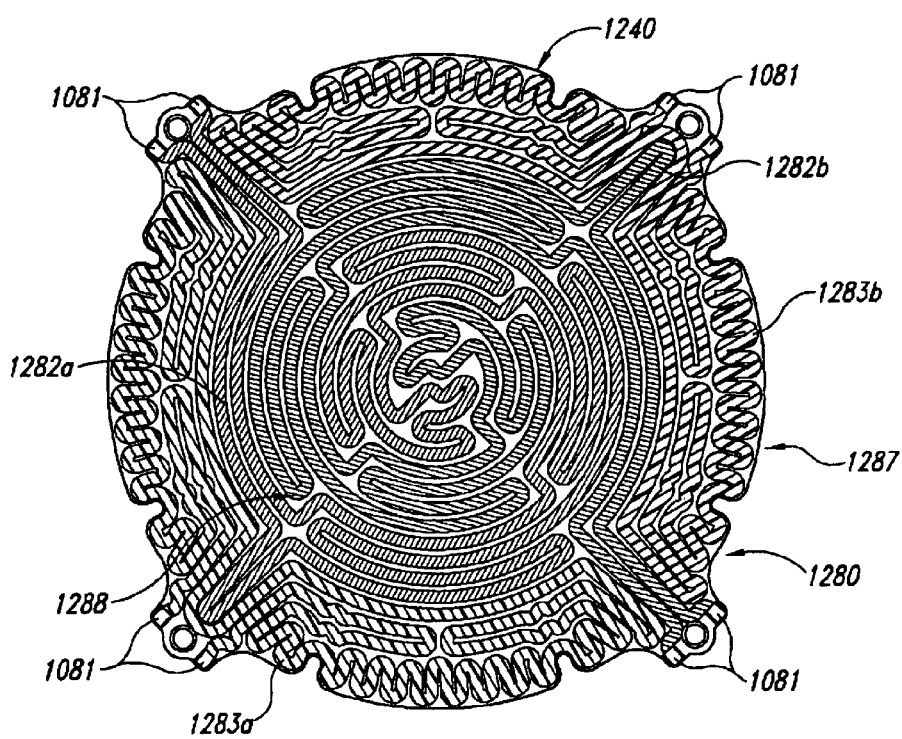
FIG. 15 is a plan view of a heat source having four resistive heat elements in accordance with another embodiment of the invention.

FIG. 15 is a top plan view of the heat source 1240 having four electrical resistance heat generation elements 1280 in accordance with an embodiment of the invention. In one aspect of this embodiment, two inner circuits 1282 supply power to the inner region 1288 of the heat source 1240 and two outer circuits 1283 provide power to the outer region 1287. In one aspect of this embodiment, the circuits 1282, 1283 can cover approximately 67% of the surface area of the heat source 1240. In other embodiments, the circuits 1282, 1283 can cover a greater or lesser percentage of the heat source surface area.

In a further aspect of this embodiment, each of the four circuits 1282, 1283 can be controlled independently to vary the power supplied to the power source 1240. Alternatively, one or more of the circuits can be coupled to another circuit to be controlled together. For example, the inner circuits 1282 can be coupled together and controlled by a single controller and the outer circuits 1283 can be coupled to each other and controlled from a separate controller. In either embodiment, the circuits 1282, 1283 can be configured to provide heat to the heat source 1240 at a rate per unit area that corresponds generally to the analytical results described above with reference to FIG. 14. For example, portions of the inner circuits 1282 and the outer circuits 1283 may be laid along circumferential lines with portions of each electrical element 1080 doubled back upon itself to form adjacent circumferential segments. The circumferential segments can be positioned closer together in the outer region 1287 than in the inner region 1288 to increase the power per unit area provided by the heat source 1240. In both the outer region 1287 and the inner region 1288, the spacing between adjacent circumferential segments can decrease in the radial outward direction to provide an increase in power per unit area corresponding to the power increase factor as described above.

One feature of the arrangements described above with reference to FIGS. 13–15 is that elongated electrical resistance heaters having a generally uniform cross-sectional shape and cross-sectional area can be laid out over the surface of the heat source in a manner that generates heat at different rates in different regions of the heat source. Accordingly, the resistance heaters can have a simple shape and construction, while also being capable of accounting for variations in heat transfer rates to and from the heat source and the microelectronic workpiece W. For example, in one embodiment, the heat source 1240 can heat the microelectronic workpiece W to a steady temperature of 285 degrees Celsius with a variation across the surface of the microelectronic workpiece W of from about 3 degrees Celsius to about 4 degrees Celsius. In other embodiments, the heat source can provide other steady-state temperatures with other temperature variations.

Figure 16:
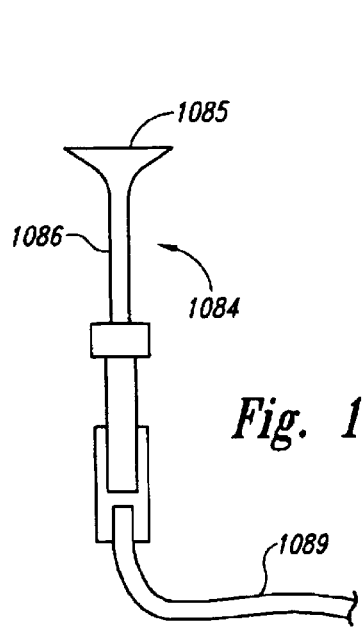
FIG. 16 is a side elevation view of an electrical connector in accordance with another embodiment of the invention.

FIG. 16 is a cross-sectional, side elevational view of a connector 1084 that can provide electrical power to the electrical elements 1080, 1280 described above with reference to FIGS. 13 and 15. In one aspect of this embodiment, each connector 1084 includes a flared contact surface 1085 that engages one of the contact pads 1081 of the electrical element 1080, 1280. In one embodiment, the contact surface 1085 can include a material that is a relatively good electrical conductor and a relatively poor heat conductor. One such material is a nickel/iron alloy, such as Alloy 42, available from Ed Fagen, Inc. of Franklin Lakes, N.J. In a further aspect of this embodiment the contact surface can be coated with a 100 microinch-thick layer of nickel and a 100 microinch-thick layer of gold, and brazed to the contact pads 1081 of the heat source 1040 (FIG. 13).

The connector 1084 can further include a shaft 1086 extending away from the contact surface 1085 and configured for coupling to a lead 1089 attached to an electrical power source (not shown). In still a further aspect of this embodiment, the shape of the shaft 1086 can be selected to offset conductive heat losses through the connector 1084. For example, the shaft 1086 can have a reduced diameter in a region between the contact surface 1085 and the lead 1089 which locally increases the electrical resistance of the connector 1084 and causes the connector 1084 to heat in this region. The electrical resistance heat generated in this region can offset the conductive thermal losses from the connector 1084.

Figure 17:
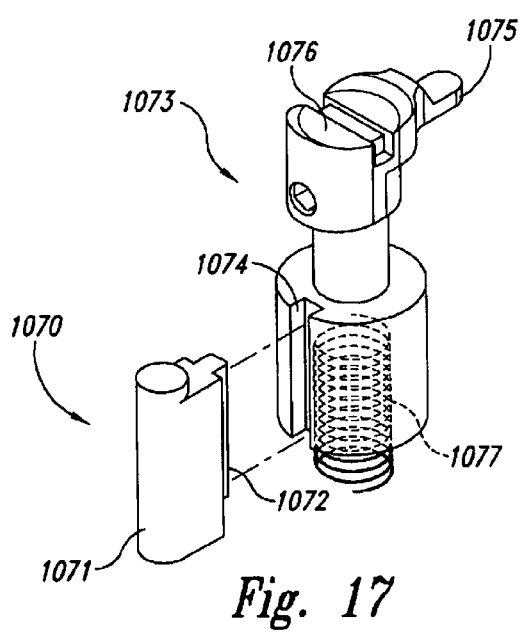
FIG. 17 is a partially exploded, side isometric view of a workpiece support in accordance with an embodiment of the invention.

FIG. 17 is a top isometric view of one of the workpiece supports 1070 described above with reference to FIG. 10. In one aspect of this embodiment, the workpiece support 1070 includes a support post 1071 and a support fixture 1073. The support post 1071 can include a spline 1072 that is slidably received in a groove 1074 of the support fixture 1073. The support fixture 1073 can further include a finger 1075 that extends radially inwardly to support the microelectronic workpiece W (FIG. 10). A plurality of workpiece supports 1070 are arranged circumferentially around the heat source 1040 (FIG. 10) with the fingers 1075 extending radially inwardly over the heat source 1040 to support the microelectronic workpiece W above the heat source 1040. Each workpiece support 1070 can include an engaging surface 1076 that is engaged by the lid 1020 (FIG. 10) as the lid 1020 moves downwardly to its closed position. Accordingly, the lid 1020 can move the support fixtures 1073 and the microelectronic workpiece W downwardly until the microelectronic workpiece W engages the heat source 1040 and the lid 1020 closes. An internal spring 1077 biases each support fixture 1073 upwardly to disengage the microelectronic workpiece W from the heat source 1040 when the lid 1020 opens. Stop members (not shown in FIG. 17) stop the upward travel of the support fixtures 1073 before the lid 1020 reaches its fully open position to allow clearance between the microelectronic workpiece W and the lower surface of the lid 1020 during installation and removal of the workpiece W.

Figure 18:
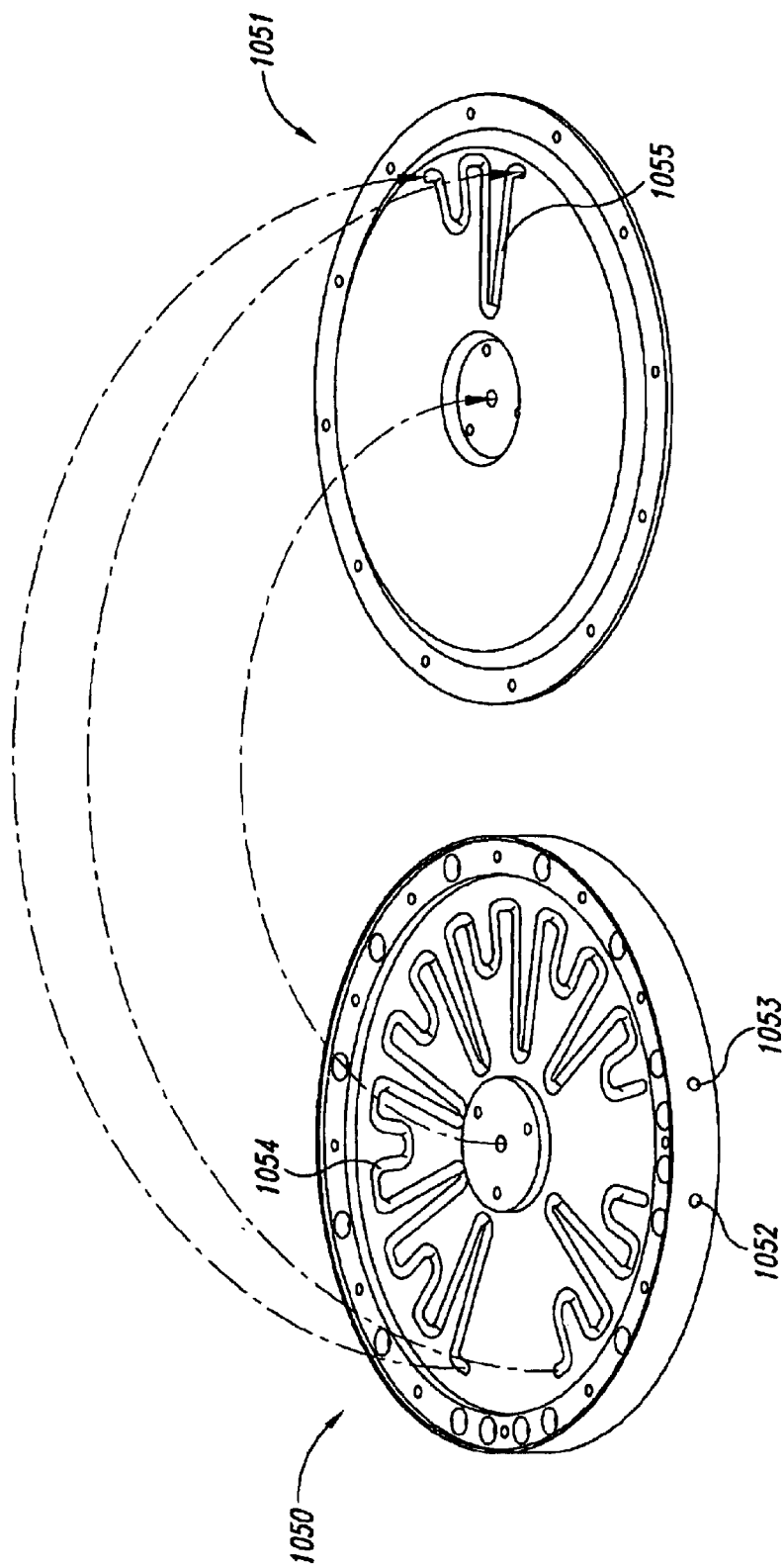
FIG. 18 is a partially exploded, top isometric view of a cooling source in accordance with an embodiment of the invention.

FIG. 18 is a partially exploded, top isometric view of an embodiment of the second heat sink 1050 described above with reference to FIG. 10. In one aspect of this embodiment, the second heat sink 1050 can include a fluid supply port 1052 and a return port 1053, each coupled to the cooling channel 1054. The cooling channel 1054 initially has an open upper surface that is sealed when the heat sink cap 1051 is attached to the second heat sink 1050. Accordingly, cooling fluid can be supplied to the cooling channel 1054 through the supply port 1052 and can exit the second heat sink 1050 through the return port 1053. In one embodiment, the path of the cooling fluid through the cooling channel 1054 in the second heat sink 1050 is interrupted by the presence of the connecting channels 1028*a*, 1028*b* and/or 1028*c*. Accordingly, the cooling channel 1054 can detour downwardly into a coupling channel 1055 positioned in the heat sinkcap 1051, then back to the cooling channel 1054 to complete the circuit from the supply port 1052 to the return port 1053.

The operation of an embodiment of the apparatus 1000 described above with reference to FIGS. 10–18 is explained below with reference to FIG. 10. The operation of the upper chamber 1003*a* can be independent of the operation of the lower chamber 1003*b*. Accordingly, for either chamber 1003*a*, 1003*b*, the lid 1020 is initially moved to the raised or open position shown in FIG. 10. The chamber volume 1008 can be purged with a relatively low flow rate of inert gas, such as $N_2$, flowing through the purge fluid passageway 1022 via the purge fluid port 1023. The heat source 1040 can idle at an average temperature of approximately 50 degrees Celsius. Alternatively, the heat source 1040 can be turned off or deactivated, and in another alternate embodiment, the heat source 1040 can be fully activated. In still a further alternate embodiment, the heat source 1040 can idle at a temperature other than 50 degrees Celsius. In any of the foregoing embodiments, the first heat sink 1060 can be positioned against the second heat sink 1050 to cool the first heat sink 1060.

The microelectronic workpiece W is then moved (with the applied material side facing upward in one embodiment) into the open chamber by a robotic transfer mechanism. The transfer mechanism rests the microelectronic workpiece W on the workpiece supports 1070 and withdraws. The lid 1020 then moves downwardly to the closed position and as it does so, engages the workpiece supports 1070 and moves them downwardly until the workpiece W engages the heat source 1040. A vacuum is applied to the vacuum apertures 1041 via the vacuum port 1042 to draw the workpiece W into close -thermal engagement with the heat source 1040. The vacuum can be applied before, during or after the lid closing operation. The purge fluid to the chamber volume 1008 is then replaced with a flow of process gas (for example, 1 to 10 liters per minute of $N_2$, Ar, $H_2$ or $He_2$). When the gas is supplied at more than one flow rate, the apparatus 1000 can include a mass flow controller and/or a multi-port valved manifold to selectively control the flow of gas into the chamber volume 1008.

The heat source 1040 is then activated to heat the microelectronic workpiece W to a selected temperature for a selected period of time. For example, when the microelectronic workpiece W includes a copper layer, the workpiece W can be heated to a temperature in the range of from about 210 degrees Celsius to 290 degrees Celsius for a period of from about 30 seconds to about 90 seconds. In one specific example, the copper layer can be heated to about 250 degrees Celsius for about 60 seconds. Accordingly, the copper layer can be annealed such that the grain structure of the layer changes (e.g., the size of the grains forming the layer can increase). In other embodiments, the workpiece W can be heated to other temperatures for other periods of time depending on the chemical composition of the material targeted by the process, and by the result expected to be achieved by the process. The increase in temperature from the idle temperature can begin before, during or after the lid closing operation. The increase in temperature from the idle temperature to the target process temperature can be controlled using a closed-loop temperature sensor feedback control, such as a proportional integral control, a proportional integral derivative control or a multi-variable temperature control.

After the microelectronic workpiece W has been heated, the first heat sink 1060 can move upwardly into engagement with the lower surface of the heat source 1040 to cool the heat source 1040 and the microelectronic workpiece W. A vacuum is applied to the vacuum supply passageway 1062 via the vacuum port 1065 to draw the first heat sink 1060 into close thermal engagement with the heat source 1040. In one embodiment, the microelectronic workpiece W can be cooled to a temperature below 70 degrees Celsius in 18 seconds. The flow of process gas is then replaced with a flow of purge gas. After the cooling phase is complete, the first heat sink 1060 moves downwardly into engagement with the second heat sink 1050 to cool the first heat sink 1060.

Simultaneously, the lid 1050 can be raised to open the chamber 1003, and the transfer mechanism 620 can be moved into the open chamber to engage the microelectronic workpiece W and remove it for further processing. The second heat sink 1050 can be cooled during or after contact with the first heat sink 1060 by providing cooling fluid to the cooling channel 1054.

An advantage of an embodiment of the apparatus 1000 described above with reference to FIGS. 10–18 is that it can be of modular construction. Accordingly, any number of chambers 1003 can be stacked, one above the other, to reduce the footprint occupied by the chambers. The chambers can also be integrated as they are stacked so that the bottom portion of an upper chamber defines the top portion of the chamber below. Another feature of an embodiment of the apparatus 1000 described above with reference to FIGS. 10–18 is that the heat source 1040 and the second heat sink 1050 do not move relative to the rest of the apparatus. Instead, the first heat sink 1060 and the microelectronic workpiece W move relative to the heat source 1040 to transfer heat to and from the microelectronic workpiece W. An advantage of this feature is that the number of movable couplings for providing electrical power, purge fluid communication and vacuum communication to moving parts can be reduced by comparison with some conventional arrangements. Still further features of an embodiment of the apparatus 1000 are that the heat source 1040 has a low thermal mass and is positioned above the heat sinks 1050, 1060. Accordingly, the heat source (and therefore the workpiece W) can cool relatively quickly, and any gas heated by the heat source 1040 will tend to rise away from (rather than toward) the heat sinks 1050, 1060. An advantage of this arrangement is that the workpiece can heat and cool quickly, increasing the throughput of the apparatus relative to conventional devices.

In other embodiments, the apparatus 1000 can have other configurations. For example, the heat supplied by the heat source 1040 can be provided devices other than the electrical element 1080. The cooling provided to the second heat sink 1050 can be provided by mechanisms other than chilled fluid. The actuators moving the lid 1020 and the first heat sink 1060 can be powered by devices other than pneumatic devices. The apparatus 1000 (and/or other heat transfer apparatuses described above with reference to FIGS. 2A–18) can be configured to perform thermal processes other than annealing. For example, the apparatuses can heat a microelectronic workpiece W to reflow solder on the workpiece W, cure or bake photoresist on the workpiece W, and/or perform other processes that benefit from and/or require an elevated temperature. The heat source of the apparatus can heat the microelectronic workpiece conductively by contacting the workpiece directly, and/or conductively via an intermediate gas or liquid, and/or convectively via an intermediate gas or liquid, and/or radiatively. The heat source and the workpiece support can be fixed relative to each other or one or both of the heat source and the workpiece support can be moveable relative to the other. The first heat sink can be moveable relative to the heat source and the second heat sink or alternatively these components can be fixed relative to each other and can selectively heat or cool the workpiece by introducing fluid media between the heat source and the first heat sink and/or between the first heat sink and the second heat sink.

Numerous modifications may be made to the foregoing system without departing from the basic teachings thereof. Although the present invention has been described in substantial detail with reference to one or more specific embodiments, those of skill in the art will recognize that changes may be made thereto without departing from the scope and spirit of the invention.

What is claimed is:

1. An apparatus for thermally processing a microelectronic workpiece, comprising:

a workpiece support positioned to engage and support the microelectronic workpiece;

a heat source having a solid engaging surface positioned to engage a surface of the microelectronic workpiece, the heat source having a plurality of vacuum aperture portions coupleable to a vacuum source, with the solid engaging surface being generally continuous between the vacuum aperture portions, the heat source further having a heat generator attached directly to and/or integral with the heat source, at least one of the heat source and the workpiece support being movable relative to the other between a first position with the microelectronic workpiece contacting the engaging surface of the heat source and a second position with the microelectronic workpiece spaced apart from the engaging surface, the heat source being sized to transfer heat to the microelectronic workpiece at least sufficient to thermally process a selected material of the microelectronic workpiece when the microelectronic workpiece is engaged with the heat source in the first position; and first and second heat sinks with the second heat sink spaced apart from the heat source and coupled to a supply of cooling fluid, the second heat sink further having an engaging surface with vacuum apertures coupled to a vacuum source and the first heat sink positioned between the second heat sink and the heat source, the first heat sink being movable relative to the second heat sink between a first position and a second position, the first heat sink being engaged with the engaging surface of the second heat sink to cover the vacuum apertures and cool the first heat sink when the first heat sink is in the first position, the first heat sink being engaged with the heat source to cool the heat source and the microelectronic workpiece when the microelectronic workpiece is engaged with the heat source and the first heat sink is in the second position.

2. The apparatus of claim 1, wherein the workpiece support is sized to support only a single microelectronic workpiece and the heat source is configured to contact no more than one microelectronic workpiece during a given processing cycle.

3. The apparatus of claim 1, further comprising a purge fluid channel having an inlet coupleable to a source of purge fluid and an outlet proximate to the workpiece support, the purge fluid channel being positioned to conduct the purge fluid from the source of purge fluid to a region adjacent to the microelectronic workpiece when the microelectronic workpiece is supported by the workpiece support.

4. The apparatus of claim 1, wherein the heat source includes an electrical resistance heater.

5. The apparatus of claim 1, wherein the heat source has an electrical resistance element with a contact portion, and wherein the apparatus further comprises an electrically and thermally conductive connector having a first end and a second end opposite the first end, the connector being engaged with the contact portion of the electrical resistance element toward the first end of the connector, the connector being coupleable to a source of electrical current toward the second end of the connector, a cross-sectional area distribution of the connector between the first and second ends and transverse to a flow of electrical current through the connector being sized to generate electrical resistance heating at least equal to a loss of heat through the connector by thermal conduction.

6. The apparatus of claim 1, wherein the heat source has a first region configured to transfer heat to the microelectronic workpiece a first rate per unit area of the microelectronic workpiece, the heat source further having a second region configured to transfer heat to the microelectronic workpiece at a second rate per unit area of the microelectronic workpiece, the second rate per unit area being greater than the first rate per unit area.

7. The apparatus of claim 1, further comprising the microelectronic workpiece.

8. The apparatus of claim 1, wherein the heat source is sized to transfer heat to the microelectronic workpiece at a rate sufficient to anneal the selected material of the microelectronic workpiece.

9. The apparatus of claim 1, wherein the selected material includes solder and wherein the heat source is sized to transfer heat to the microelectronic workpiece at a rate sufficient to reflow the solder.

10. The apparatus of claim 1, wherein the selected material includes photoresist and wherein the heat source is sized to transfer heat to the microelectronic workpiece at a rate sufficient to cure and/or bake the photoresist.

11. The apparatus of claim 1 wherein the heat source has an outer edge and an inner region inward of the outer edge and further wherein a power generated by the heat source per unit area of the microelectronic substrate increases gradually in a radial direction inwardly from the outer edge over at least a portion of the heat source.

12. The apparatus of claim 1 wherein the heat source is generally circular and includes an elongated electrical resistance heater having a generally constant cross-sectional area, and wherein at least a portion of the heater is doubled back on itself to extend along a plurality of spaced apart circumferential lines in both the first region and the second region, circumferential lines in the first region being spaced apart from each other by a first distance, circumferential lines in the second region being spaced apart by a second distance less than the first distance.

13. The apparatus of claim 1 wherein the heat source includes a substrate having a substrate surface area and an electrical resistance heater adjacent to the substrate and having a heater resistance surface area, the resistance heater surface area being approximately 67% of the substrate surface area.

14. The apparatus of claim 1 wherein the heat source includes a first electrical resistance heater in the first region coupled to a first controller and a second electrical resistance heater in the second region coupled to a second controller, the first and second controllers being independently controllable to provide power to a first region independent of power provided to a second region.

15. An apparatus for thermally processing at least first and second microelectronic workpieces, comprising:
a first thermal processing chamber having a first workpiece support positioned to engage and support the first microelectronic workpiece, the first chamber further having a first heat source sized to transfer to the first microelectronic workpiece heat sufficient to thermally process the first microelectronic workpiece when the first microelectronic workpiece is at least proximate to the first heat source;
a second thermal processing chamber proximate to the first chamber and having a second workpiece support positioned to engage and support the second microelectronic workpiece, the second chamber further having a second heat source sized to transfer to the second microelectronic workpiece heat sufficient to thermally process the second microelectronic workpiece when the second microelectronic workpiece is at least proximate to the second heat source, and with the first chamber positioned above the second chamber such that a portion of the first chamber between the first and second chambers is common to the second chamber and defines a lower portion of the first chamber and an upper portion of the second chamber; and
first and second heat sinks with the second heat sink spaced apart from the first heat source and coupled to a supply of cooling fluid and the first heat sink positioned between the second heat sink and the first heat source, the first heat sink being movable relative to the second heat sink between a first position with the first heat sink engaged with the second heat sink to cool the first heat sink, and a second position with the first heat sink engaged with the first heat source to cool the heat source and the first microelectronic workpiece when the first microelectronic workpiece is engaged with the first workpiece support.

16. The apparatus of claim 15 wherein the first workpiece support is movable relative to the first heat source between a first position and a second position, and further wherein the first heat source includes a solid engaging surface engaged with the first microelectronic workpiece when the workpiece support is in the first position, the solid engaging surface being spaced apart from the first microelectronic workpiece when the workpiece support is in the second position, and wherein the apparatus further comprises a heat sink beneath the heat source.

17. The apparatus of claim 15 wherein the first chamber includes a purge gas channel positioned to supply purge gas to the second chamber.

18. The apparatus of claim 15 wherein the first chamber and the second chamber are modular and interchangeable.

19. The apparatus of claim 15 wherein the first chamber includes a first lid movable between an open position to receive the first microelectronic workpiece and a closed position to at least partially enclose the first microelectronic workpiece, and further wherein the second chamber includes a second lid movable between an open position to receive the second microelectronic workpiece and a closed position to at least partially enclose the second microelectronic workpiece, and wherein the apparatus further comprises a base member supporting the first heat source, with the second lid interengaged with and depending from the base member.

20. The apparatus of claim 15, wherein the first workpiece support is sized to support no more than one microelectronic workpiece at a time and the first heat source is sized to contact no more than one microelectronic workpiece at a time.

21. An apparatus for thermal processing a microelectronic workpiece, comprising:
an apparatus support;
a heat source supported by the apparatus support;
a workpiece support positioned proximate to the heat source to engage and support the microelectronic workpiece relative to the heat source;
a heat sink proximate to the heat source and positioned to selectively transfer heat from the heat source to cool the heat source and the microelectronic workpiece, at least one of the heat sink and the heat source being movable relative to the other between a disengaged position and an engaged position, the heat sink having an engaging surface that is compressible between an uncompressed configuration when the heat sink is disengaged from the heat source and a compressed configuration when the heat sink is engaged with the heat source; and wherein the heat sink is a first heat sink and the engaged position is a first engaged position, and wherein the apparatus further comprises a second heat sink spaced apart from the first heat sink and coupled to a supply of cooling fluid, and wherein the first heat sink is positioned between the second heat sink and the heat source, the first heat sink being movable relative to the second heat sink between the first engaged position with the first heat sink engaged with the heat source and a second engaged position with the first heat sink engaged with the second heat sink to cool the first heat sink.

22. The apparatus of claim 21 wherein the workpiece support is movable relative to the heat source between a first position with the microelectronic workpiece contacting the heat source and a second position with the microelectronic workpiece spaced apart from the heat source.

23. The apparatus of claim 21 wherein the first heat sink includes a passive conduction heat sink having no cooling fluid links coupled thereto.

24. The apparatus of claim 21 wherein a thermal mass of the first heat sink exceeds a thermal mass of the heat source.

25. The apparatus of claim 21 wherein a thermal capacity of the first heat sink exceeds a thermal capacity of the heat source.

26. The apparatus of claim 21 wherein the workpiece support is sized to support no more than one microelectronic workpiece at a time and the heat source is sized to contact no more than one microelectronic workpiece at a time.

27. The apparatus of claim 21 wherein the heat source includes a vacuum aperture coupleable to a vacuum source and facing the microelectronic workpiece when the microelectronic workpiece is engaged with the workpiece support to draw the microelectronic workpiece toward the heat source.

* * * * *